United States Patent
Sambucco et al.

(10) Patent No.: US 9,664,713 B2
(45) Date of Patent: May 30, 2017

(54) HIGH SPEED TRACKING DUAL DIRECTION CURRENT SENSE SYSTEM

(71) Applicant: Infineon Technologies Austria AG, Villach (AT)

(72) Inventors: Adriano Sambucco, Villach (AT); Karl Norling, Villach (AT)

(73) Assignee: Infineon Technologies Austria AG, Villach (AT)

( * ) Notice: Subject to any disclaimer, the term of this patent is extended or adjusted under 35 U.S.C. 154(b) by 101 days.

(21) Appl. No.: 14/528,772

(22) Filed: Oct. 30, 2014

(65) Prior Publication Data

US 2016/0124027 A1    May 5, 2016

(51) Int. Cl.
G01R 15/12 (2006.01)
G01R 19/00 (2006.01)

(52) U.S. Cl.
CPC ................. G01R 19/0092 (2013.01)

(58) Field of Classification Search
CPC ...... G01R 15/12; G01R 15/144; G01R 19/00; G01R 19/30; G01R 21/06; G01R 31/261; G01R 31/2623
USPC ..................................................... 324/76.11
See application file for complete search history.

(56) References Cited

U.S. PATENT DOCUMENTS

| | | | | |
|---|---|---|---|---|
| 6,642,752 B1 * | 11/2003 | Nagaraj | ............... | G11C 27/026 327/94 |
| 8,890,737 B2 * | 11/2014 | Schrom | ................. | H02M 3/157 341/144 |
| 2003/0173941 A1 | 9/2003 | Harris et al. | | |
| 2003/0231012 A1 * | 12/2003 | Corva | ................... | H02M 3/156 323/285 |
| 2005/0035746 A1 | 2/2005 | Bernacchia et al. | | |
| 2005/0219926 A1 | 10/2005 | Tai et al. | | |

(Continued)

FOREIGN PATENT DOCUMENTS

| CN | 1448819 A | 10/2003 |
|---|---|---|
| CN | 1717856 A | 1/2006 |

(Continued)

OTHER PUBLICATIONS

Shin, J-W, et al., "Bridgeless Isolated PFC Rectifier Using Bidirectional Switch and Dual Output Windings," IEEE Engergy Conversion Congress and Exposition (ECCE), Sep. 17-22, 2011, pp. 2879-2884.

(Continued)

*Primary Examiner* — Son Le
*Assistant Examiner* — Akm Zakaria
(74) *Attorney, Agent, or Firm* — Shumaker & Sieffert, P.A.

(57) ABSTRACT

A tracking current sense system is described that includes a first current tracking system, a second current tracking system, and a pre-biasing device. The first current tracking system is configured to replicate a first current flowing through a first switch and the second current tracking system is configured to replicate a second current flowing through a second switch. The pre-biasing device is configured to pre-bias the second current tracking system based on first information detected at the first current tracking system that is indicative of the first current and also, pre-bias the first current tracking system based on second information detected at the second current tracking system that is indicative of the second current.

19 Claims, 12 Drawing Sheets

(56) References Cited

U.S. PATENT DOCUMENTS

2010/0277142 A1* 11/2010 Tan ................... H02M 7/53803
                                                    323/268
2012/0206191 A1* 8/2012 Llewellyn ............ H03K 17/163
                                                    327/538

FOREIGN PATENT DOCUMENTS

| CN | 1816964 A | 8/2006 |
| CN | 101666824 A | 3/2010 |
| DE | 10223977 C1 | 9/2003 |
| EP | 1432107 A2 | 6/2004 |
| WO | 2004051832 A1 | 6/2004 |
| WO | 2005004318 A1 | 1/2005 |

OTHER PUBLICATIONS

U.S. Appl. No. 14/528,819, by Adriano Sambucco et al., filed Oct. 30, 2014.
U.S. Appl. No. 14/206,816, by Adriano Sambucco, filed Mar. 12, 2014.
Office Action from U.S. Appl. No. 14/528,819, dated Mar. 2, 2017, 6 pp.

* cited by examiner

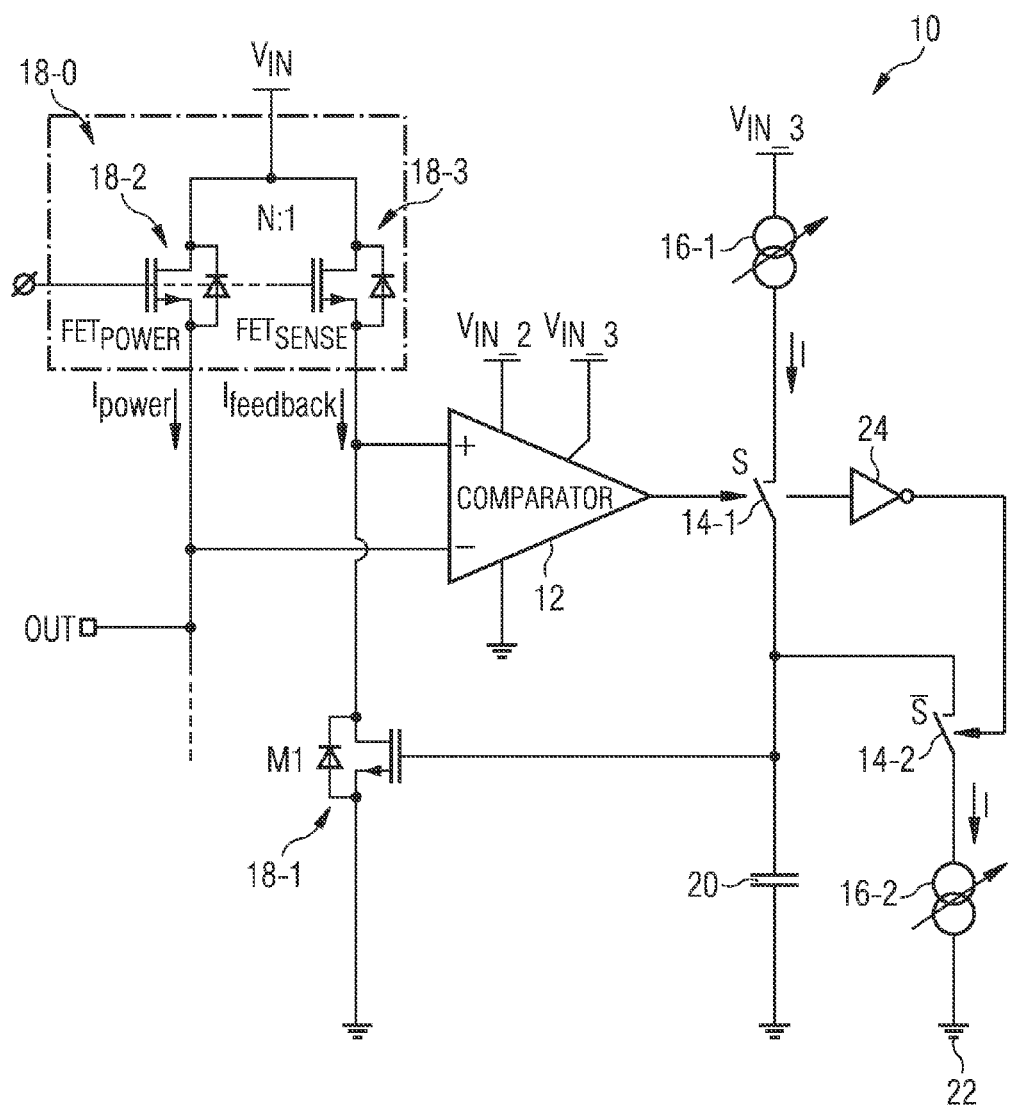

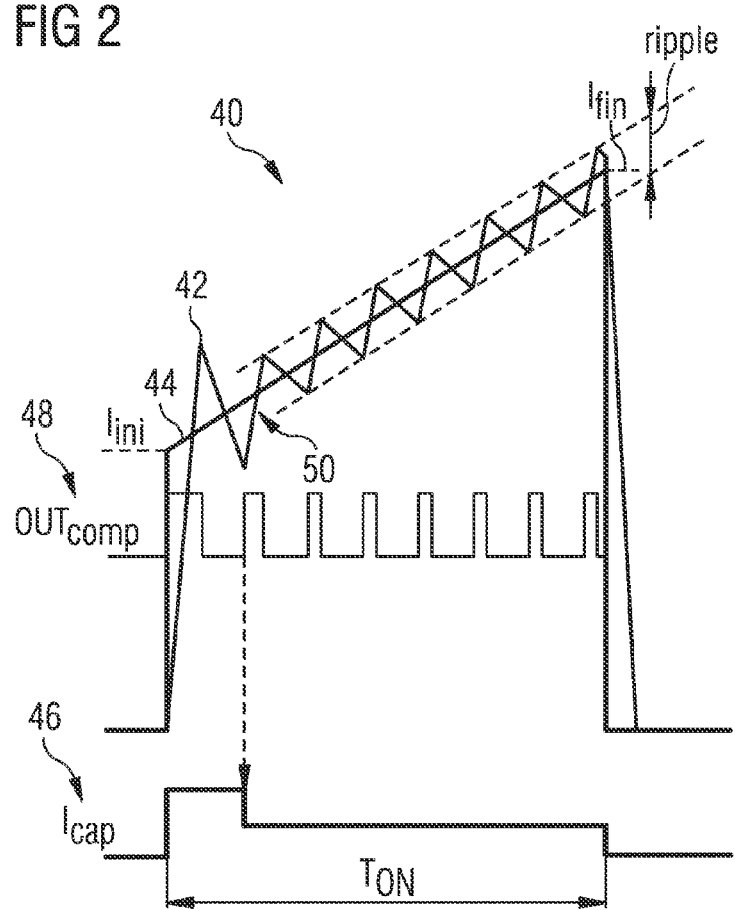
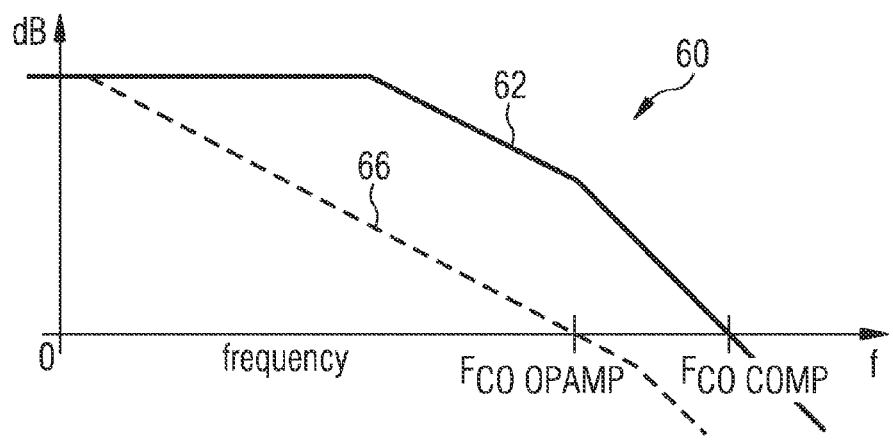

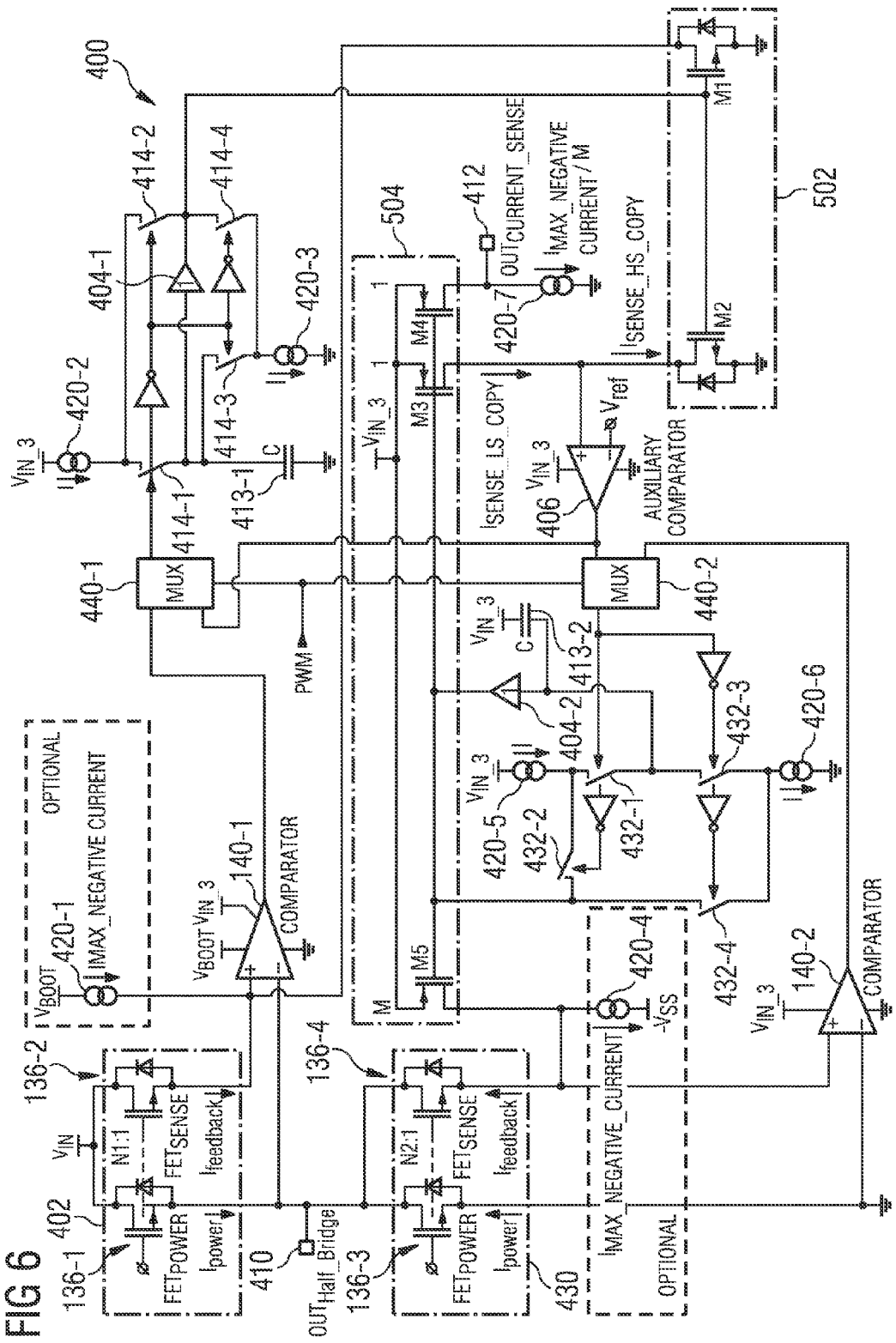

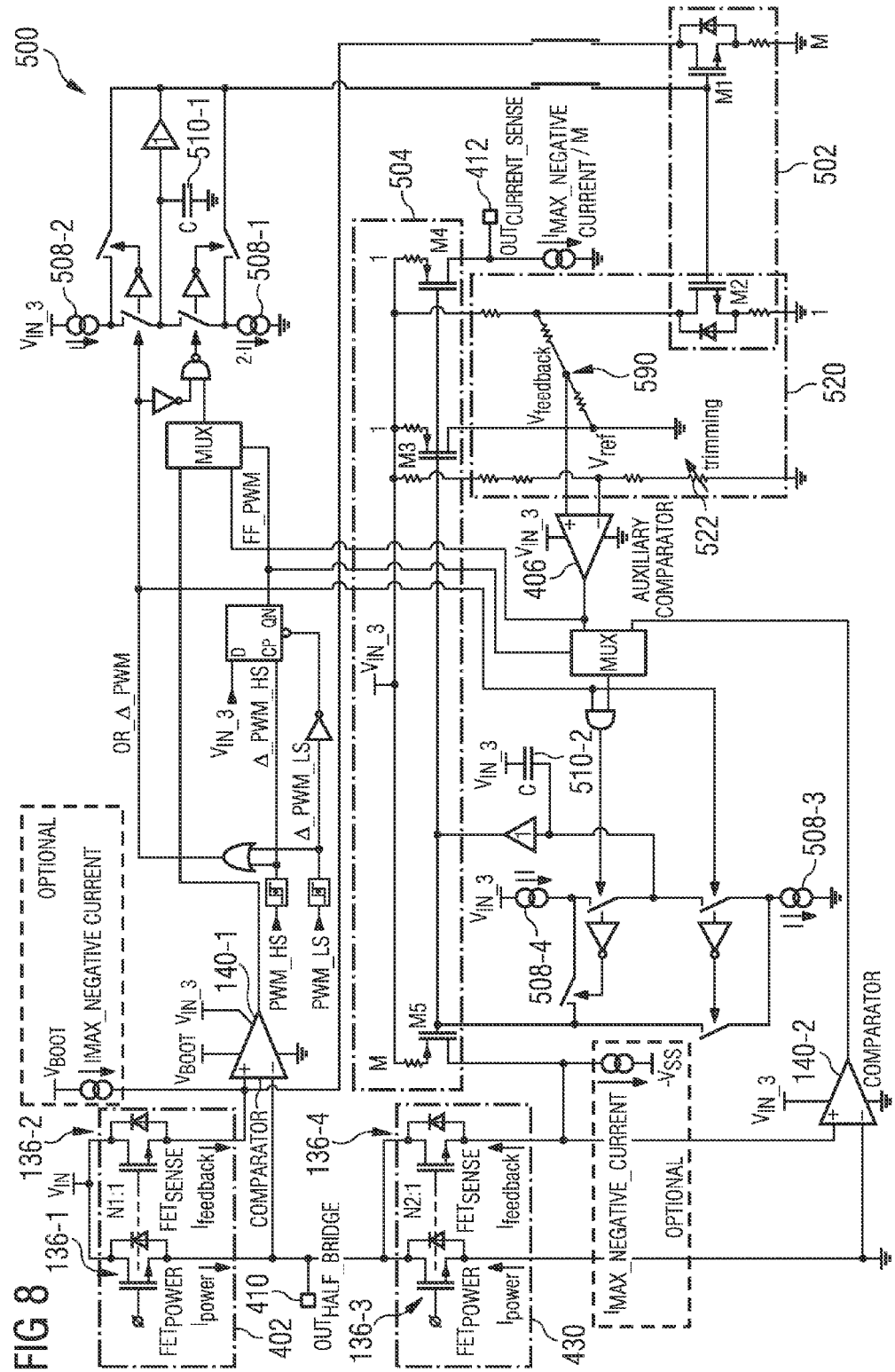

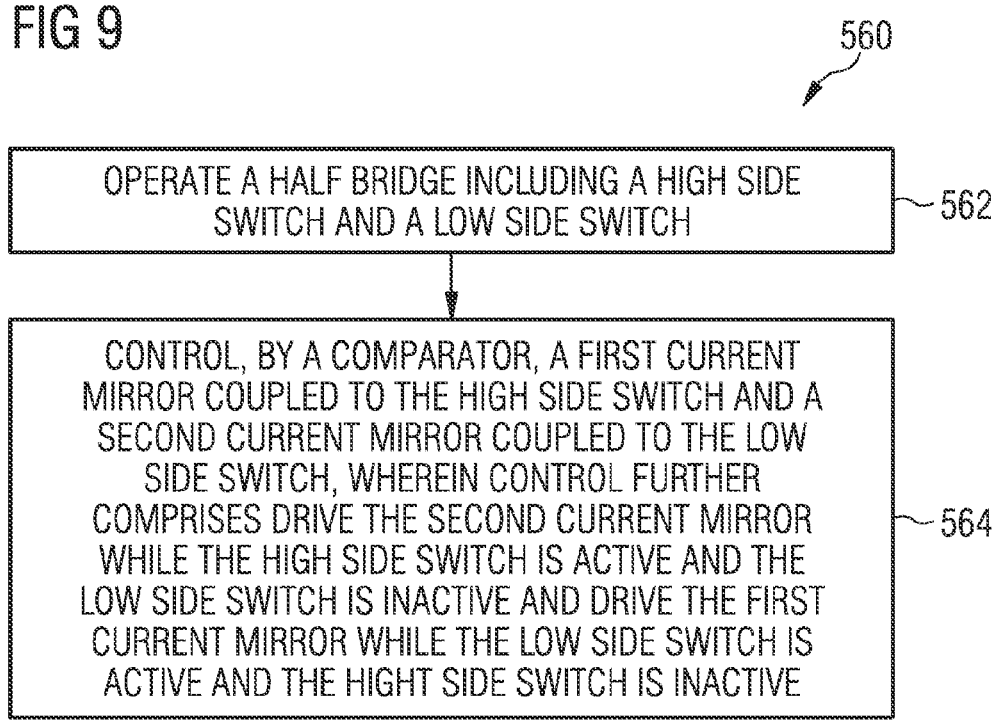

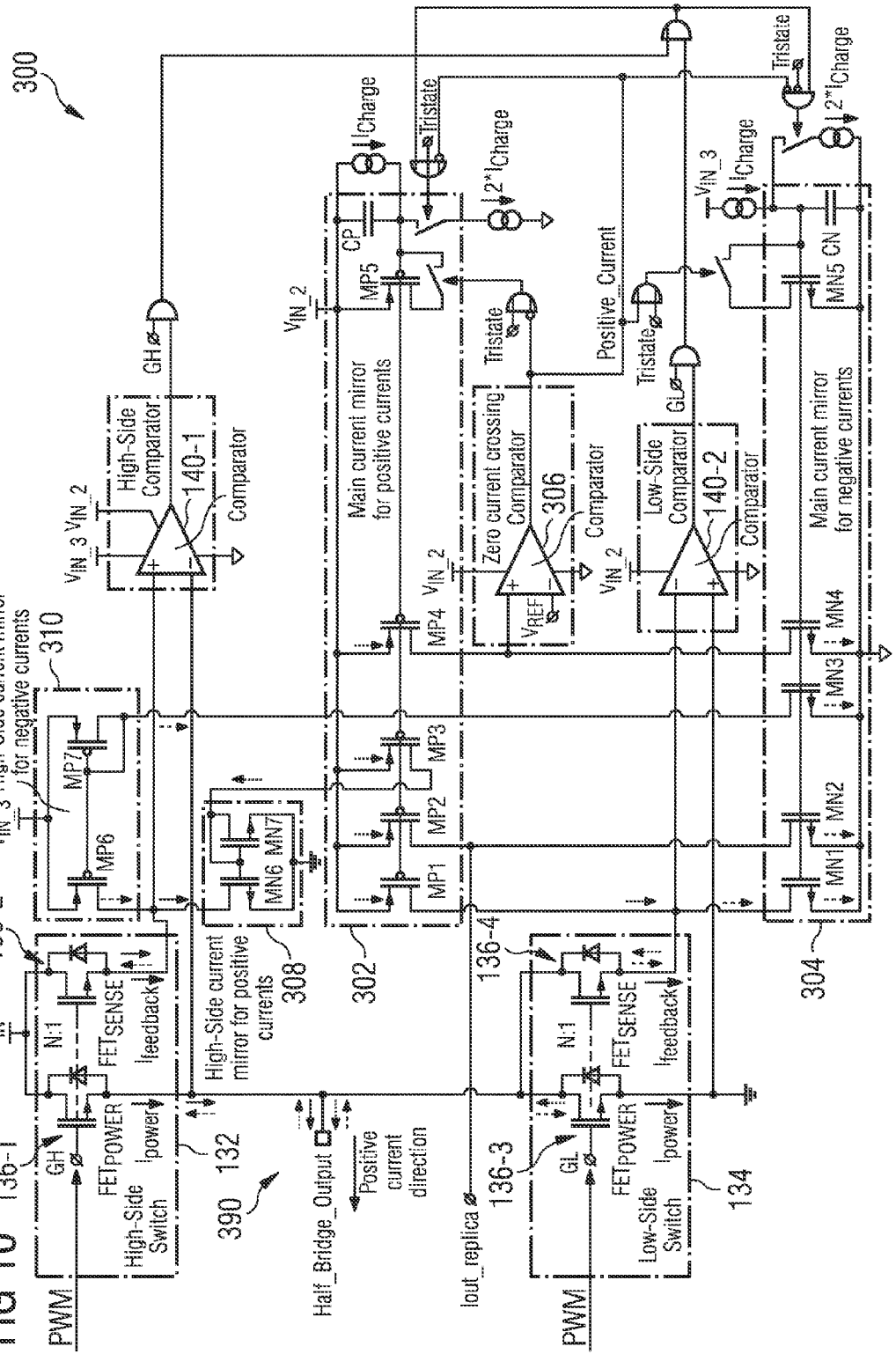

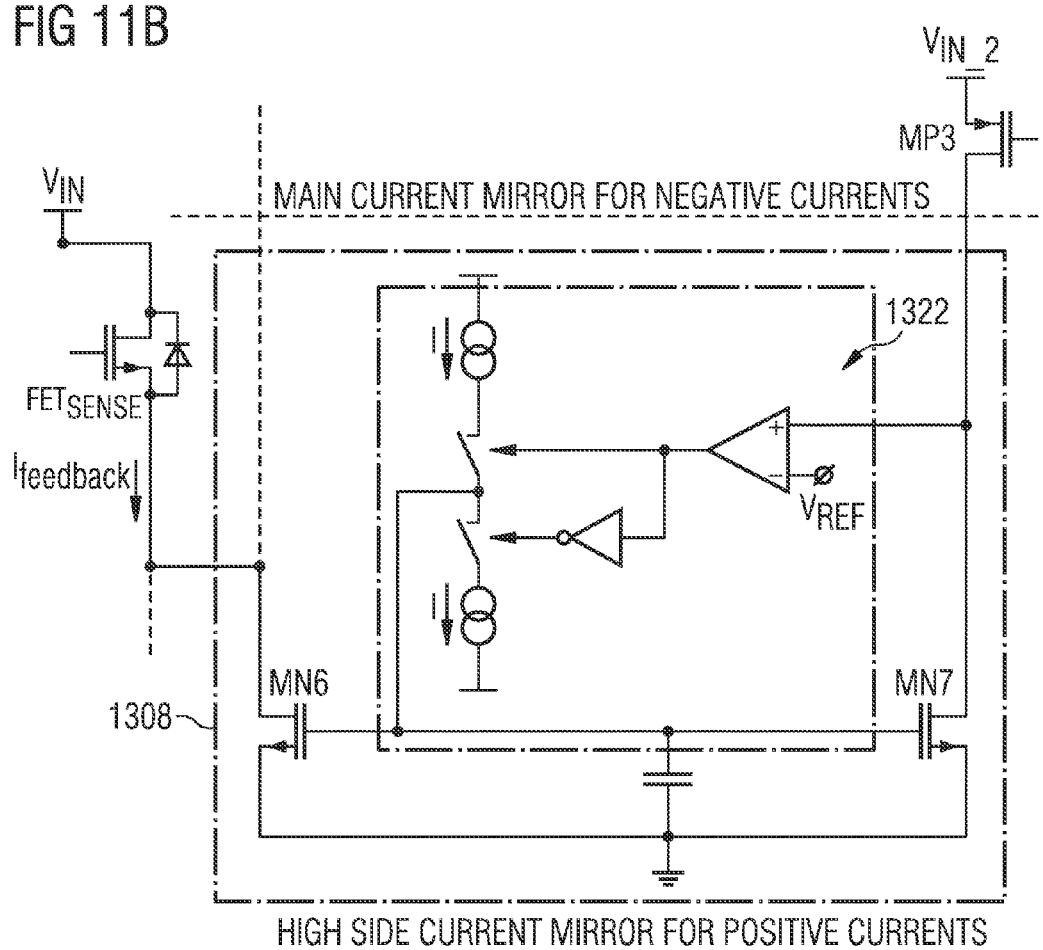

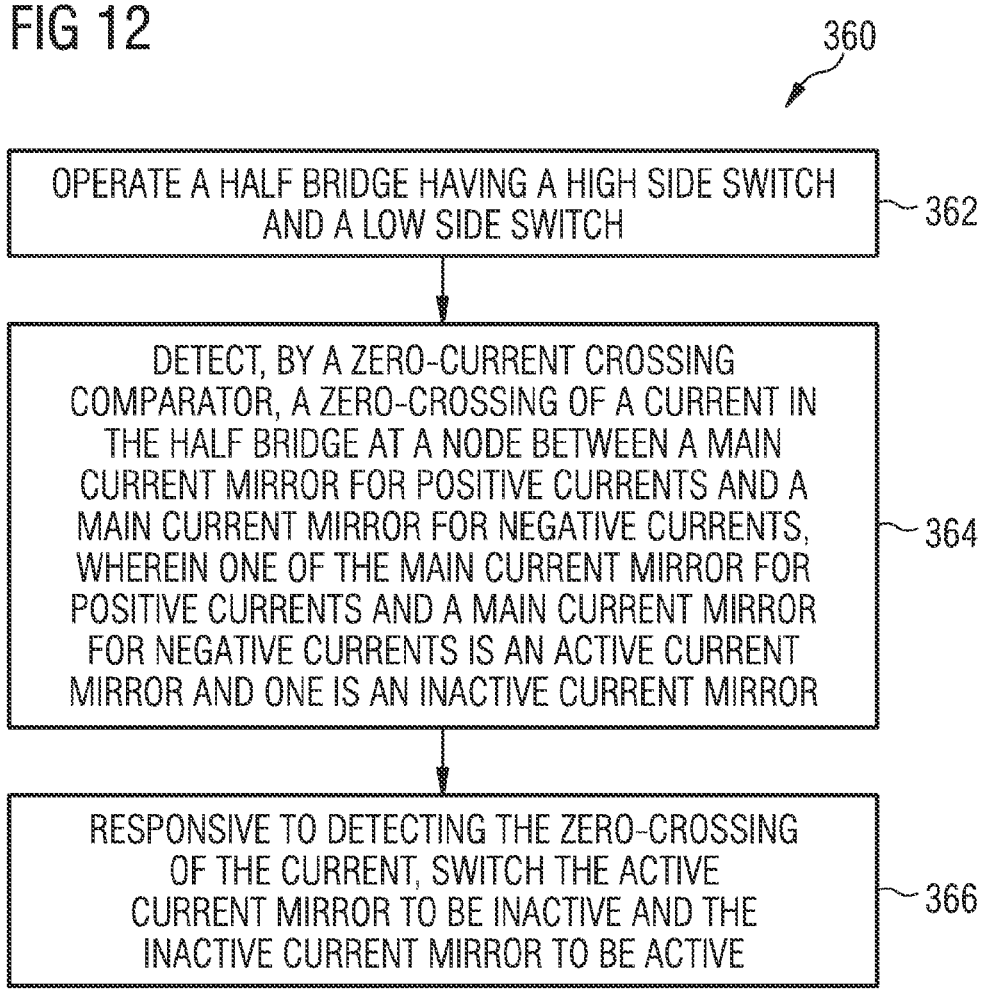

HIGH SPEED TRACKING DUAL DIRECTION CURRENT SENSE SYSTEM

TECHNICAL FIELD

This disclosure is generally related to current sensing techniques in electronic circuitry.

BACKGROUND

A tracking current sense circuit typically provides a tracking current and may be used in applications such as DC-DC converters for server and mobile computer applications. Conventional tracking current sense circuits often include an operational amplifier which has a limited slew rate and a limited bandwidth due to capacitances that are introduced for stability. Using an operational amplifier results in the tracking current sense circuit having a low limit speed, and thus may not be able to sink or source current with speeds that is sometimes required by modern technologies/systems.

SUMMARY

In general, this disclosure describes techniques and circuits for improving the speed, bandwidth, and stability of tracking current sense systems. Some of the techniques and circuits described herein enable a tracking current sense system to pre-bias the current of an inactive side of a half bridge such that the level of the current at the inactive side is at or near a level of an operating current when the inactive side of the half bridge later becomes active. In this manner, pre-biasing the inactive side of a half bridge may reduce the amount of settling time that occurs when a side of the half bridge is activated.

Some of the techniques and circuits described herein may enable a tracking current sense system to track positive and negative currents. For example, using a zero-current crossing comparator to detect a change in polarity of a current or by using an offset current generator that is set to supply the maximum negative current that could be required.

Some of the techniques and circuits described herein may enable a tracking current sense system to track positive and negative currents regardless of which side of a half bridge is active. As such, the tracking current sense system may track positive and negative currents in both the high and low side switches of the half-bridge.

In some examples, the techniques of the disclosure are directed to a tracking current sense system comprising: a first current tracking system configured to replicate a first current flowing through a first switch; a second current tracking system configured to replicate a second current flowing through a second switch; and a pre-biasing device. The pre-biasing device is configured to: pre-bias the second current tracking system based on first information detected at the first current tracking system that is indicative of the first current; and pre-bias the first current tracking system based on second information detected at the second current tracking system that is indicative of the second current.

In some examples, the techniques of the disclosure are directed a method that includes receiving, at a pre-biasing device, information detected by a first tracking current sense system that is indicative of a first current flowing through a first switch. The method further includes pre-biasing, by the pre-biasing device, based on the information, a second tracking current sense system configured to replicate a second current flowing through a second switch.

In some examples, the techniques of the disclosure are directed to a tracking current sense system including means for replicating a first current flowing through a first switch, and means for replicating a second current flowing through a second switch. The tracking current sense system further includes means for pre-biasing the second current tracking system based on first information received from the first current tracking system that is indicative of the first current, and means for pre-biasing the first current tracking system based on second information received from the second current tracking system that is indicative of the second current The details of one or more examples and techniques of this disclosure are set forth in the accompanying drawings and the description below. Other features, objects, and advantages of the disclosure will be apparent from the description and drawings, and from the claims.

BRIEF DESCRIPTION OF DRAWINGS

FIG. 1 is a schematic diagram illustrating an example tracking current sense system, in accordance with one or more techniques described in this disclosure.

FIG. 2 is a timing diagram illustrating an example behavior of feedback current in the tracking current system of FIG. 1, in accordance with one or more techniques described in this disclosure.

FIG. 3 is a graph illustrating an example difference between gain-bandwidth products of an operational amplifier and a comparator in a stable closed loop current sense system, in accordance with one or more techniques described in this disclosure.

FIG. 6 is a schematic diagram illustrating an example tracking current sense system for use with a half-bridge, in accordance with one or more techniques described in this disclosure.

FIG. 8 is a schematic diagram illustrating an alternative example tracking current sense system that is configured to track positive and negative currents that flow in both sides of a half bridge, in accordance with one or more techniques described in this disclosure.

FIG. 9 is a flowchart illustrating an example process for operating a tracking current sense system configured to track positive and negative currents that flow in both sides of a half bridge, in accordance with one or more techniques described in this disclosure.

FIG. 10 is a schematic diagram illustrating an example tracking current sense system that is configured to detect zero-crossings of current in a half bridge, in accordance with one or more techniques described in this disclosure.

FIGS. 11A and 11B are schematic diagrams illustrating active current mirrors for use in an example tracking current sense system, in accordance with one or more techniques described in this disclosure.

FIG. 12 is a flowchart illustrating an example process for operating a tracking current sense system having dual direction sensing, in accordance with one or more techniques described in this disclosure.

The drawings are not necessarily drawn to scale. Like reference numbers indicate like features, although variations between like features may exist in the various examples.

DETAILED DESCRIPTION

Figure 4:
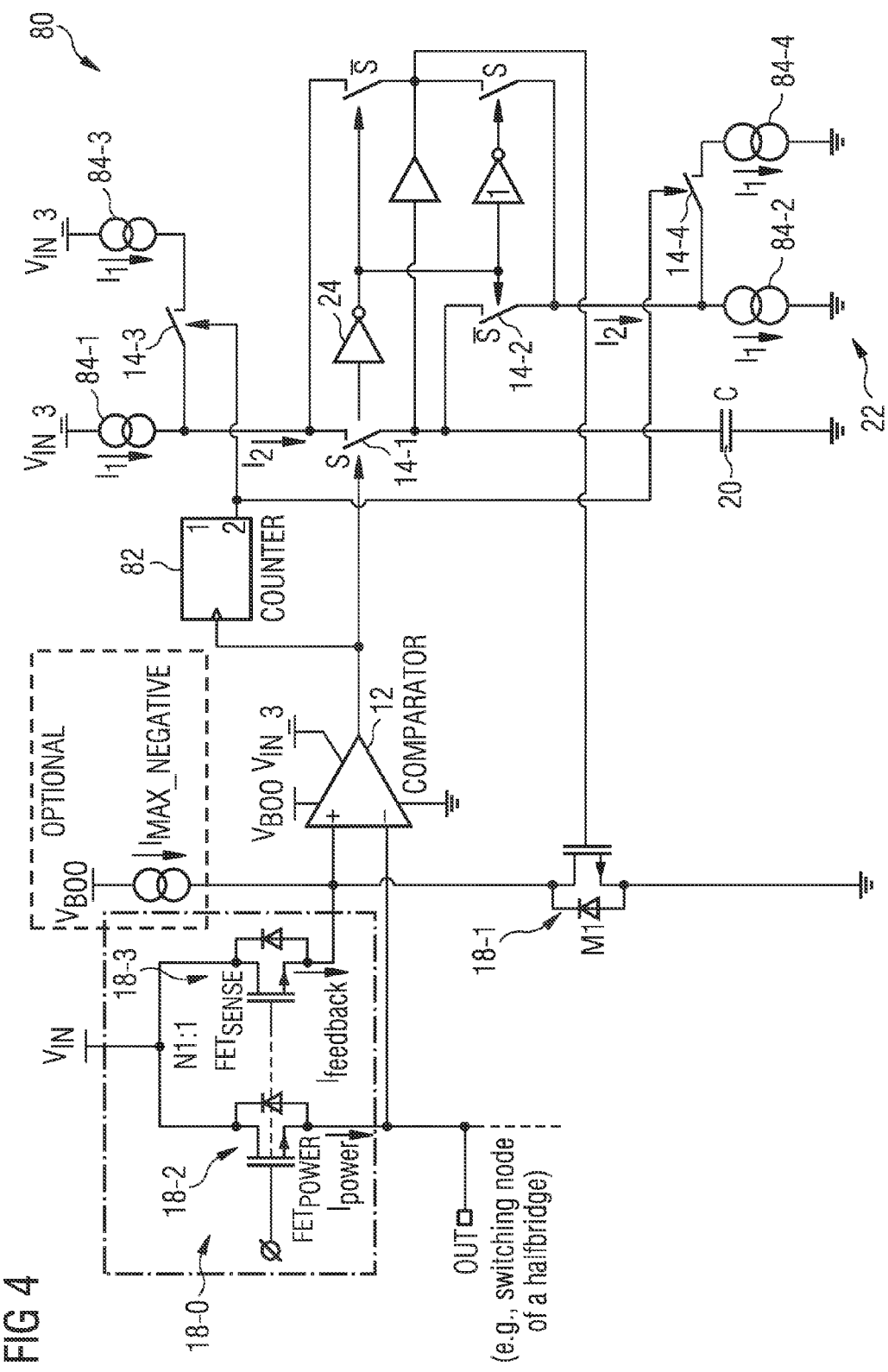
FIG. 4 is a schematic diagram illustrating an example implementation of the tracking current sense system of FIG. 1, in accordance with one or more techniques described in this disclosure.

Some power systems rely on linear sensing amplifier ("LSA") based current sensing systems to perform current tracking techniques. One drawback of LSA based current sensing systems is that an LSA may be unusable in a high-speed power system. That is, some LSA based current sensing systems may have a "residual offset" (e.g., an amount of time after performing sensing operations that the overall system is required to wait before continuing other non-sensing operations) and/or large settling times. Some power systems (e.g., step-down or "buck" converters) perform fast switching and/or high/low duty cycle operations and have very little time available for an LSA based current sensing system to perform current sensing techniques. Accordingly, LSA based current sensing systems, which have residual offsets and/or large settling times, may not settle and/or finish performing sensing operations during the time that the power system has available for sensing. Even if a LSA based current sensing system does settle or perform sensing operations within the allotted time available for performing sensing, the LSA based current sensing system may be insufficient for some power systems for other reasons (e.g., when an average current value is used). Techniques and circuits are described for improving the speed of a tracking current sense system in a power system (e.g., a DC-DC power converter, etc.). That is, the techniques and circuits described herein may reduce the overall amount of time that a power system has to allocate to a tracking current sense system to perform current sensing operations. In some examples, the techniques and circuits may enable a tracking current sense system to track both positive and negative currents and in some examples, the techniques and circuits may enable the tracking current sense system to track positive and negative currents regardless of the current's location (e.g., high side or low side) within in the power system.

FIG. 1 is a schematic diagram illustrating an example tracking current system 10, in accordance with one or more techniques described in this disclosure. Tracking current system 10 is a non-linear system which relies on comparator 12 to ensure that the two "matched" transistors 18-2 and 18-3 of power switch 18-0, simultaneously conduct with an equal current density.

In general, to cause sense transistor 18-3 and power transistor 18-2 to conduct, respectively, current $I_{feedback}$ and current $I_{power}$, with the same current density, comparator 12 first compares the respective voltage drops over matched transistors 18-2 and 18-3. Based on the difference in respective voltage drops across transistors 18-2 and 18-3, comparator 12 drives switches 14-1 and 14-2 (collectively referred to herein as "switches 14") to vary the amount of load current at the output of transistor 18-3 (e.g., the amount of load current associated with transistor 18-1). As is described below in greater detail, comparator 12 varies the amount of load current at the output of transistor 18-3 until the amount of load current is sufficient enough to cause the current density in transistor 18-3, as transistor 18-1 generates current $I_{feedback}$, to match the current density in transistor 18-2 while transistor 18-2 conducts current $I_{power}$.

Power switch 18-0 is a transistor based, high side switch of a half-bridge. Although shown as a high side switch of a half-bridge, the principles and techniques described herein can also be applied to power switch 18-0 if power switch 18-0 operates as a low side switch of a half-bridge. When power switch 18-0 is switched on, the voltage of $V_{IN}$ is applied to the output of system 10 (e.g., a switching node).

Power switch 18-0 includes transistor 18-2 (e.g., a large power transistor) and transistor 18-3 (e.g., a smaller sense transistor that functions as a current mirror of transistor 18-2). Transistors 18-2 and 18-3 may each be a field effect transistor ("FET"). In this example, the drains of transistors 18-2 and 18-3 are both connected to $V_{IN}$. In some examples, transistor 18-3 is N times smaller than transistor 18-2. Transistors 18-2 and 18-3 are controlled with the same gate signal. When transistor 18-2 is switched on transistor 18-3 is also switched on. Transistor 18-2 conducts current $I_{power}$. Transistor 18-3 conducts $I_{feedback}$.

System 10 relies on transistor 18-2 to couple the output of system 10 (e.g., labeled as "OUT") to voltage source $V_{IN}$ whereas 10 relies on transistor 18-3 to perform current sensing techniques in order to conduct $I_{feedback}$ (i.e., a replica or "tracking" current) from which, system 10 can sense the level of current $I_{power}$ associated with transistor 18-2. The level of $I_{feedback}$ out of transistor 18-3 may be N times smaller than the level of $I_{power}$ out of transistor 18-2 (e.g., as long as the drain-source voltage and gate-source voltage of transistors 18-2 and 18-3 are the same). As used throughout this disclosure, the terms "feedback current", $I_{feedback}$, tracking current, and replica current, are all used interchangeably to generally describe a current that proportionately mirrors the level of current flowing out of a power transistor. In general the term "feedback current" of $I_{feedback}$ is used for the current that flows in a sense transistor (e.g., transistor 18-3). $I_{feedback}$ equals $I_{power}/N$ when current tracking system 10 has settled. The terms "replica current" or "mirror current" generally describe a current that is a "copy" or "mirror" of the feedback current $I_{feedback}$. In other words, if current tracking system 10 were to output a current equal to $I_{feedback}$ (e.g., similar to the output of system 400 shown in FIG. 6), this output current would be referred to as a "mirror current."

Although shown as a high side switch of a half bridge, switch 18-0 may also be configured similarly to be a low side switch of a half-bridge. Switch 18-0 may be used to power a load (e.g., an inductive load) that is coupled to a switching node of a half-bridge (e.g., at node OUT). System 10 may switch transistor 18-2 of transistor 18-0 on and off to control the voltage (or in some examples, the current) at node OUT. For example, system 10 may rely on the control of switch transistor 18-2 to produce a PWM output signal at node OUT. As system 10 relies on a gate signal (e.g., derived from a pulse-width-modulation signal received from a controller that is not depicted in FIG. 1 for simplicity purposes) to cause transistor 18-2 to switch-on and off, system 10 may simultaneously drive transistor 18-3 into the same operating state (e.g., switched-on or off) as transistor 18-2 to conduct $I_{feedback}$. System 10 may rely on $I_{feedback}$ to sense or otherwise determine the amount of current $I_{power}$ coming out of transistor 18-2.

In an LSA based tracking current systems, the LSA of the other systems may pull a current through a mirror transistor, such as transistor 18-3, to match the voltage across the mirror transistor with a voltage drop across a corresponding power transistor, such as transistor 18-2, to create a mirrored current out of the mirror transistor that (e.g., N times) less than the amount of current out of the power transistor. However, there may be a substantial delay in raising the level of current through the mirror transistor to be at the proper level. Thus, other systems that have LSAs may have at least one of a residual offset or inadequate settling time with integrated/average error as a consequence.

Unlike LSA based tracking current systems, system 10 is non-linear and includes comparator 12 to drive switches 14, control variable current generators 16-1 and 16-2 (collectively referred to herein as "current generators 16") and to charge and discharge capacitor 20 to vary the amount of load current associated with transistor 18-1 and the amount of current being sunk by transistor 18-1. Tracking current system 10 may have a lower settling time and therefore, track currents quicker (i.e., in a lesser amount of time) than other tracking current sense systems.

For example, tracking current system 10 includes capacitor 20 arranged in parallel to transistor 18-1 (also referred to herein as "transistor M1"). Transistor 18-1 may be a metal oxide semiconductor field effect transistor ("MOSFET") transistor, for example, an N-type MOSFET. The transistor 18-1 is configured to operate similar to an output stage of an operational amplifier of a LSA based tracking current system. However, as described herein, tracking current system 10 does not include operational amplifiers, but rather tracking current system 10 instead relies on comparator 12 to drive switches 14 so as to control the charging and discharging of capacitor 20, in order to regulate the amount of load current associated with transistor 18-1 and regulate a feedback current $I_{feedback}$ of tracking current system 10. That is, comparator 12 may control switch 14-1 to cause current from current generator 16-1 to travel to capacitor 20. Comparator 12 may control switch 14-2 to cause current to travel away from capacitor 20 and sink at current generator 16-2.

Current generator 16-1 is connected to a high reference voltage $V_{IN\_3}$. Current generator 16-2 is connected to a low reference voltage 22. Low reference voltage 22 is shown in FIG. 1 as a ground voltage, which in the example of system 10, is at the same potential as the source of transistor 18-1. In other examples, low reference voltage may be at a different potential than the source of transistor 18-1. In this way, by controlling switches 14, comparator 12 may control current generators 16 to charge and discharge capacitor 20 such that the voltage across capacitor 20 stays within the range of the high supply voltage $V_{IN\_3}$ and low voltage supply 22.

Current generators 16 may be directly connected to a control pin of transistor 18-1. Transistor 18-1 sinks current which is at a current level consistent with a current operating point of system 10. Said differently, the tracking current $I_{feedback}$ in tracking current system 10 may oscillate around a current operating point required by transistor 18-1 to sink the desired level of tracking current. The tracking current $I_{feedback}$ in tracking current system 10 may oscillate due to a lag or delay associated with the amount of time required to charge and discharge capacitor 20. However, the amount of oscillation in the tracking current $I_{feedback}$ may be negligible for some applications as long as the oscillation has a higher frequency and lower amplitude with respect to the frequency and magnitude of the current that tracking current system 10 is tracking (e.g., $I_{power}$).

As shown in FIG. 1, one input to comparator 12 (e.g., a positive "plus" pin) is coupled to the source of transistor 18-3 and the other input of comparator 12 (e.g., a negative "minus" pin) is coupled to the source of transistor 18-2. When the voltage at the plus pin of comparator 12 is higher than the voltage at the minus pin, comparator 12 may charge capacitor 20 by causing switch 14-1 ("S") to switch closed or otherwise operate in an "on-state" to conduct current traveling from current generator 16-1 and by further causing switch 14-2 ("$\overline{S}$") to switch open or otherwise operate in an "off-state" to inhibit current from traveling to current generator 16-2. Charging capacitor 20 in this way may cause the amount of current being sunk into transistor 18-1 to increase. In this way, transistor 18-1 acts like a current source for generating a feedback or tracking current that is pulled from transistor 18-3.

When the voltage at the plus pin of comparator 12 is lower than the voltage at the minus pin, comparator 12 may discharge capacitor 20 by causing switch 14-1 to switch open and further causing switch 14-2 to switch closed. In this way, current generator 16-2 may draw current from capacitor 20 to discharge capacitor 20 and reduce the current sinking capability of transistor 18-1. One example behavior of the tracking current $I_{feedback}$ is shown in FIG. 2, discussed below. Comparator 12 may have a small hysteresis and/or delay in controlling switches 14.

Accordingly, system 10 may enable sense transistor 18-3 and power transistor 18-2 to conduct, respectively, current $I_{feedback}$ and current $I_{power}$ with the same current density by relying on comparator 12. Comparator 12 compares the voltage drop across matched transistors 18-2 and 18-3, and based on the comparison, drives switches 14-1 and 14-2 so as to vary the amount of load current at the output of transistor 18-3 until the amount of load current is sufficient enough to match the current density of transistor 18-3 with the current density of transistor 18-2.

The level of current being handled by current generators 16 may be selected according to a desired dynamic and/or speed capability of tracking current system 10. For example, if current generators 16 can handle a larger amount of current, capacitor 20 can be charged and discharged more quickly and cause tracking current system 10 to operate more quickly. In some examples, parameters of tracking current system 10 are selected such that the current in the transistor being measured does not ramp up faster than the current in transistor 18-1. Further, limitation may also be placed on how fast the current rises from the beginning to the end of the $T_{ON}$ cycle of transistors 18-2 and 18-3.

As used throughout the disclosure, a $T_{ON}$ cycle of a transistor is generally defined as a period of time when the transistor is closed, conducting current through its conduction channel, or otherwise operating in an on-state rather than the $T_{OFF}$ cycle of the transistor which represents the time when the transistor is open, not conducting through its conduction channel, or otherwise operating in an off-state. For example, $T_{ON}$ of transistors 18-2 and 18-3 represent the period of time when transistors 18-2 and 18-3 are closed or otherwise operating in an on-state rather than being open or otherwise operating in an off-state. With reference to a half-bridge configuration, the term $T_{ON}$ cycle of the half-bridge is generally used to describe the period of time when the high side switch of the half-bridge is closed or otherwise operating in an on-state and the low side switch of the half-bridge is open or otherwise operating in an off-state. With further reference to a half-bridge configuration, the term $T_{OFF}$ cycle of a half-bridge is generally used to describe the period of time when the high side switch of the half-bridge is open or otherwise operating in an off-state and the low side switch of the half-bridge is closed or otherwise operating in an on-state.

In some examples, one or more current generators 16 may be selected to be capable of generating a large current such that charging and discharging capacitor 20 is within a determined time period appropriate for the application to which tracking current system 10 is to be applied. Thus, various components of tracking current system 10 can be selected for qualities that enable achievement of specific speeds in the tracking current.

FIG. 2 is a timing diagram 40 illustrating an example behavior of tracking current, $I_{feedback}$, in tracking current system 10 of FIG. 1, in accordance with one or more techniques described in this disclosure. Timing diagram 40 illustrates example real behavior of the tracking current of system 10 ($I_{feedback}$), represented by line 42, over a time period $T_{ON}$. Line 44 shows an ideal output current ($I_{power}/N$) for $I_{feedback}$. Over $T_{ON}$, capacitor 20 is charged and discharged with a current represented by line 46 ("$I_{cap}$").

Line 42 shows ripples, oscillations, or spikes, which may be due to several factors including the speed of comparator 12, a trans-conductance of comparator 12, the current ("I") used to charge/discharge capacitor 20, and the value of capacitor 20 itself. In some examples, these parameters are chosen in order to reduce or minimize the amount of ripples, oscillations, or spikes of $I_{feedback}$ shown in line 42. In one example, the period of the first saw tooth may be approximately 2.5 nanoseconds ("ns"). In some examples, various trade-offs are balanced when reducing the amount of ripples, oscillations, or spikes. For example, while making comparator 12 faster may result in shorter reaction time and therefore a higher oscillation frequency of the ripple and also a lower amplitude of the ripple, making comparator 12 faster may also result in a sustained maximum tracking speed or tracking slope. Whereas, while lowering the charging current of the current sources 16 may result in lower oscillation frequency of the ripple and also a lower amplitude of the ripple, lowering the charging current of the current sources 16 may also result in the maximum tracking speed or tracking slope to be reduced. Additionally, while increasing size of capacitor 20 may results in a lower oscillation frequency of the ripple and also a lower amplitude of the ripple, increasing size of capacitor 20 may also result in a reduction of the maximum tracking speed or tracking slope.

A point $I_{ini}$ on ideal $I_{feedback}$ line 44 represents a start current level ("$I_{ini}$") and a point $I_{fin}$ on line 44 represents an end current level ("$I_{fin}$"). To reach the stating current level $I_{ini}$ as soon as possible, tracking current system 10 includes variable current generator 16-1. Variable current generator 16-1 may change the current following a rule set according to the desired parameters for tracking current system 10, for example, using the positive and negative transition of comparator 12. In the example of FIG. 2, the current $I_{cap}$, represented with line 46, is reduced when the second positive transition of comparator 12 occurs.

FIG. 3 is a graph 60 illustrating an example difference between gain-bandwidth products of an operational amplifier and a comparator in a stable closed loop current sense system, in accordance with one or more techniques described in this disclosure. That is, graph 60 compares a gain-bandwidth product of the operational amplifier 66 that can be used to track the current and a gain-bandwidth product of the comparator 62.

Conventional tracking current sense circuits may use operational amplifiers, to control current sources 16 in a linear manner, that have limited slew rate (e.g., the maximum possible rate of change of signal at any point throughout the circuit) and limited bandwidth due to capacitors introduced for stability. Because of these limitations, conventional tracking current sense circuits are not able to sink or source current with sufficient speed (for example, with a frequency more than 1 megahertz ("MHz") with duty cycle lower than 15%) that is sometimes requested in modern DC-DC converters (such as, for example, a buck converter) for applications such as servers and notebooks (for example, laptop computers and other mobile computing devices). Not sinking or sourcing current with sufficient speed may introduce a systematic offset in the tracking current. In some scenarios, the tracking current does not reach a tracking condition because $T_{ON}$ is too short. One or more capacitors are included within the operational amplifier to stabilize the closed loop. The one or more capacitors must be charged and discharged, which may introduce a time lag.

Unlike other linear type systems, for instance, LSA based tracking current systems that rely on operational amplifiers (also referred to herein as "op-amps"), the non linear systems described herein, such as system 10, rely on one or more comparators to control the flow of current into and out of one or more current generators that charge and discharge a capacitor which is used to speed up the current tracking process. The non-linear systems of this disclosure include a comparator which is faster than the current sense system including the operational amplifier because it does not include the stabilizing capacitor. Some of the example devices described herein may be ten to twenty times faster than conventional LSA based tracking current systems.

FIG. is a schematic diagram illustrating an example implementation of tracking current sense system 10 of FIG. 1, in accordance with one or more techniques described in this disclosure. System 80 is an implementation of tracking current sense system 10 that includes optional features that may reduce the settling time and the associated amount of ripples, oscillations, or spikes in the tracking current $I_{feedback}$ described above with respect to FIGS. 1 and 2.

Some differences between current sense system 10 of FIG. 1 and system 80 of FIG. 4 are such that system 80 includes counter 82, variable current generators 16 of FIG. 1 have been replaced with current generators 84-1 and 84-2. Two additional "boost" current generators 84-3 and 84-4 are as well as some additional digital logic is also added to system 80.

In operation of system 80, switch 14-1 starts out operating in a switched-off or open state and switches 14-2, 14-3, and 14-4 start out operating in a switched-on or closed state. When a load is coupled to node OUT and transistor 18-2 is switched-on, the current $I_{power}$ begins to flow through transistor 18-2. Being that the plus pin of comparator 12 is coupled to the source of transistor 18-3 and the minus pin of comparator 12 is coupled to the source of transistor 18-2, when the current $I_{power}$ begins to flow through transistor 18-2, the plus pin of comparator 12 may be at a higher potential than the negative pin of comparator 12 because, unlike the load current that is loading the node OUT, there is no load current loading transistor 18-3, which results in the comparator output going high.

When the output of comparator 12 goes high, switch 14-1 transitions to operating in a switched-on or closed state, and switch 14-2 switches-off or open. Capacitor 20 will start to be charged from current generator 84-1 and current generator 84-3 and the gate-source voltage of transistor 18-1 will increase. When the gate-source voltage of transistor 18-1 reaches a gate threshold voltage level, the drain current of transistor 18-1 will begin to flow. The drain current will increase as long as the gate-source voltage at transistor 18-1 increases (e.g., as capacitor 20 is charged). If the gate-source voltage at transistor 18-1 becomes too large, the drain current may become larger than desired (e.g., exceeding a maximum drain current level) and may cause the voltage at the plus pin of comparator 12 to drop below the voltage level of the minus pin of comparator 12. When the voltage level at the plus pin of comparator 12 falls below the voltage level of the minus pin of comparator 12, comparator 12 may change its output from high to low. Responsive to the output of comparator 12 going low, switch 14-1 may switch-off or open and switch 14-2 may switch-on or close and Capacitor 20 may start to discharge with current being drawn from capacitor 20 to current generator 84-2 and current generator 84-4.

System 80 may continue to operate with capacitor 20 charging and discharging in this way such that the tracking current $I_{feedback}$ may oscillate at or approximately around an ideal current value (e.g., as shown in line 44 of FIG. 2). Counter 82 may count a quantity of positive transitions of comparator 12 (e.g., how many times that the output of comparator 12 transitions from a low output where capacitor 20 is discharging to a high output where capacitor 20 is charging). At point 50 shown in FIG. 2, one or more switches (e.g., switches 14-3 and 14-4) of boost current generators 84-3 and 84-4 will be open.

FIG. 4 shows that when switch 14-3 is switched-on or closed, the sum of the respective currents $I_1$ from current sources 84-1 and 84-3 equals $I_1+I_1=I_2$. In other words, both current generators 84-1 and 84-3 contribute $I_1$ of the total current $I_2$. When switch—14-3 is open, generator 84-3 provides zero current and the current from current generator 84-1 remains $I_1$ so that the current associated with $I_2$ equals $I_1$. Similarly, FIG. 4 shows that when switch 14-4 is closed, the sum of the respective currents $I_1$ from current sources 84-2 and 84-4 equals $I_1+I_1=I_2$. In other words, both current generators 84-2 and 84-4 contribute $I_1$ of the total current $I_2$. When switch—14-4 is open, generator 84-4 provides zero current and the current from current generator 84-2 is $I_1=I_2$.

In this way, the settling speed can be doubled in the beginning/start-up when $I_1+I_1=I_2$, and transistor 18-1 can more quickly reach an ideal drain current. However, because the charging current $I_2$ may be high when $I_1+I_1=I_2$, the ripple associated with the charging current may be large due to a limit in the speed/propagation delay of comparator 12. In order to reduce the ripple and increase the accuracy of the tracking current $I_{feedback}$ such that the tracking current more closely corresponds to the ideal current of transistor 18-1, the charging boost current of boost current generators 84-3 and 84-4 are removed such that the charging current drops from $2*I_1$ to $I_1$.

In order to prevent current generator 84-1 and 84-2 from entering a triode region (also referred to as an ohmic region) when not being used, the current generator 84-1 or 84-2 that is not connected to capacitor 20 is connected to a "voltage copy" of the voltage across capacitor 20 (e.g., which may be achieved with a buffer). This allows for the reconnection of the unused current generator 84-1 or 84-2 to capacitor 20 without introducing an extra charge that would otherwise be introduced due to different voltages between the output of the previously unused current generator 84-1 or 84-2 and capacitor 20.

In some examples, a higher charging current (e.g., $2*I_1$) is used at the beginning of operations of system 80 in order to charge capacitor 20. For example, boost current generators 84-3 and 84-4 may be used only at the beginning of $T_{ON}$ to charge and discharge capacitor 20. Boost current generators 84-3 and 84-4 may be connected in such a way as to cause $I_2$ to equal approximately ten micro amperes ("μA") from the initiation of $T_{ON}$ until the second positive transition of comparator 12. Capacitor 20 may have a value of six hundred fifty femto farads ("fF") and may be charged and discharged when $I_2$ is equal to five μA after the second positive transition of comparator 12.

During a $T_{OFF}$ phase of the switch, the current sense circuit may hold the gate bias, opening all switches 14, and leaving capacitor 20 charged at its present value. In order to reduce the settling time for the next $T_{ON}$ phase the boost current generators 84-3 and 84-4 may be used until the second positive transition of the output of comparator 12. Even if transistor 18-1 is on during the $T_{OFF}$ phase, transistor 18-1 may be operating in the triode region with the voltage across the drain and source terminals of transistor 18-1 being less than the saturation voltage (e.g., $V_{DS}<V_{DS\_SAT}$). Note, as will become evident later in the description of FIG. 4, the maximum current that can flow to transistor 18-1 is $I_{MAX\_NEGATIVE}$.

Thus, the tracking current $I_{feedback}$ of system 80 may oscillate around a certain value (e.g., the ideal current of transistor 18-1) and does not need to be stable to perform as an adequate tracking current system for some applications. In addition, comparator 12 does not need to be "capped" to slow it down like is needed for LSA type tracking current systems. The fact that comparator 12 can operate "uncapped" may lead to an increase in system 80's bandwidth as compared to other LSA type tracking current systems. Additionally, with comparator 12 uncapped, system 80 may be able to keep an amplification at a higher bandwidth and gains a wider bandwidth and may be faster overall.

System 80 is configured to track both positive and negative currents. As used herein, current that exits, or travels out of a transistor, represents a "positive current" and current that enters or travels into a transistor, represents a "negative current." For example, the current $I_{POWER}$ is shown in FIG. 4 with a directional arrow pointing away from, or exiting, a source terminal of transistor 18-2, and as such, $I_{power}$ represents a positive current. Tracking current $I_{feedback}$ is shown exiting a source terminal of transistor 18-3 and is also a positive, not a negative, current. With reference to a half-bridge configuration, in which node OUT represents a switching node between a high side switch and a low side switch, a positive current refers to a current that exits from either switch of the half-bridge into the switching node, and exits from the switching node and into a load. A negative current refers to a current that exits from a load, enters the switching node, and exits from the switching node and enters either switch.

In order to be able to track both positive and negative current flowing through transistor 18-2, system 80 adds a current offset $I_{MAX\_NEGATIVE}$ to the source node of transistor 18-3 and the positive "plus" input of comparator 12. The introduction of the current offset $I_{MAX\_NEGATIVE}$ serves to make system 80 function similar to the output stage of a class A operation amplifier of a LSA type tracking current system. For example, when zero current is flowing through transistor 18-2, comparator 12 is configured to ensure that zero current is flowing through transistor 18-3 which results in 18-1 sinking an amount of current equal to $I_{MAX\_NEGATIVE}$. When a positive current flows through transistor 18-2, transistor 18-1 sinks an amount of current that is greater than $I_{MAX\_NEGATIVE}$, which results in a positive tracking current $I_{feedback}$ flowing through transistor 18-3. Conversely, when a negative current flows through transistor 18-2, transistor 18-1 sinks an amount of current that is less than $I_{MAX\_NEGATIVE}$, which results in a negative tracking current $I_{feedback}$ flowing through transistor 18-3.

Figure 5:
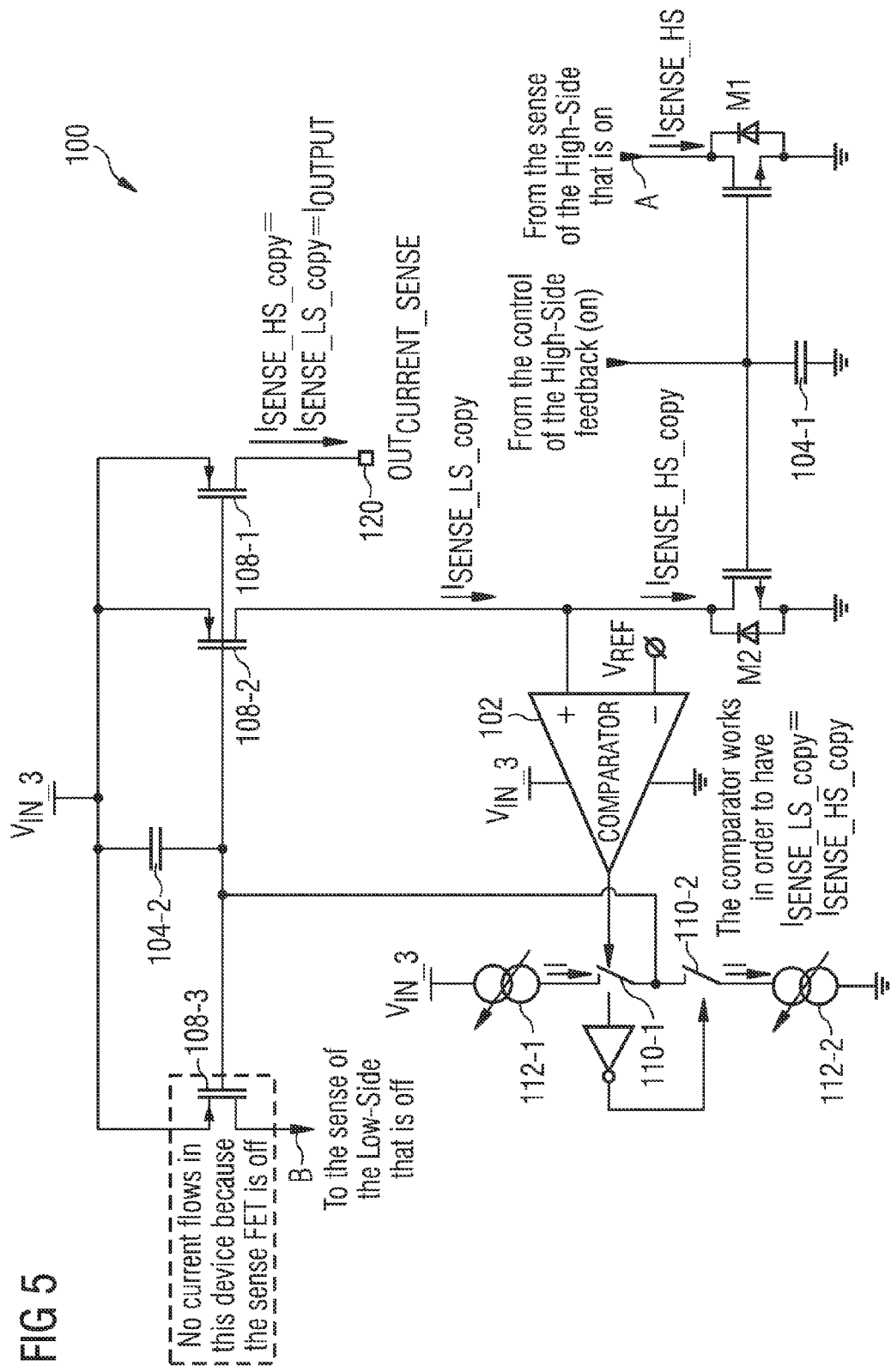
FIG. 5 is a schematic diagram illustrating an example current follower used in an example tracking current sense system that is configured to track positive current, in accordance with one or more techniques described in this disclosure.

FIG. 5 is a schematic diagram illustrating an example pre-biasing circuit 100 that is configured to pre-bias a low side replica current generator/source of a tracking current sense system, in accordance with one or more techniques described in this disclosure. For example, FIG. 5 illustrates an example (application) current follower using part of system 10 of FIG. 1 or part of system 80 of FIG. 4. In the example of FIG. 5, transistor M1 from FIG. 4 is the same as transistor M1 of FIG. 5. As such, for ease of description, system 100 of FIG. 5 is described below in the context of system 80 of FIG. 4. The current $I_{SENSE\_LS\_COPY}$ is following the current $I_{SENSE\_HS\_COPY}$. The follower is used in the tracking current sense system to source or output a current replica of the tracking current that flows in transistor 18-2 of FIG. 4, as $I_{SENSE\_HS\_COPY}$ at $OUT_{CURRENT\_SENSE}$ (i.e., pin 120).

The following description of FIG. 5 serves to provide a brief introduction to the similar pre-biasing circuit and techniques shown in FIG. 6. As such, any reference to the direction of a current flow is described with reference to the directional arrow shown at the output pin (e.g., the switching node) of the half-bridge configuration shown in FIG. 6. A positive current refers to a current flowing in the direction that travels from the high side and low side switches of the half-bridge, to the switching node, and to a load. A negative current refers to a current flowing in the direction that travels from the load, to the switching node, and to the high side and low side switches of the half-bridge.

Pre-biasing circuit 100 decreases the speed requirement of a current tracking sense system because, while one side (e.g., the high side) of the current tracking sense system may be on, pre-biasing circuit 100 can maintain the biasing of the side (e.g., the low side) that is off. Thus, the current tracking circuit that is currently off may be "ready to work" as soon as it is turned back on and may have an initial operating condition (e.g., operational biasing) corresponding to the condition present in the current tracking circuit that is currently on. Accordingly, in cases where an inductive load is coupled to the half-bridge and the load current alternates from being provided from the high side and the low side, circuit 100 may reduce the speed requirement of the sensing loop while providing a seamless hand over from sensing the current in the high side to sensing the current in the low side, and vice versa.

Pre-biasing circuit 100 is configured to couple to a source terminal (e.g., a current output) of a sense FET of a high side ("HS") current sense circuit at point A and couple to a source terminal (e.g., a current output) of a sense FET of a low side ("LS") current sense circuit at point B. In this example, the current flowing in transistor M2 is copied to transistors 108-1 and 108-2. Transistor 108-3 is on, but no current flows through it because its load (e.g., low side sense FET) is off when the high side FET is on. In some examples, when system 100 includes one or more $I_{MAX\_NEGATIVE}$ current generators (not shown in FIG. 5 but described with respect to the additional figures such as FIG. 4), transistor 108-3 can supply a maximum current of $I_{MAX\_NEGATIVE}$.

Pre-biasing circuit 100 includes a comparator 102 that maintains the current in the low side replica current generator/source ($I_{SENSE\_LS\_copy}$) at approximately the same level of current as the current in the high side replica current generator/source ($I_{SENSE\_HS\_copy}$). The output of comparator 102 drives switches 110-1 and 110-2 that control current generators 112-1 and 112-2. Pre-biasing circuit 100 includes three transistors 108-1, 108-2, and 108-3 (collectively referred to as "transistors 108") and capacitors 104-1 and 104-2. Pre-biasing circuit 100 further includes transistor M2 and transistor M1. One or more of transistors 108, M1, and M2 may be MOSFETs.

Some current tracking systems that use operational amplifiers and current mirrors to track the positive current in the half bridge loaded by an inductive load have limited speed that prevent them from handling a handover from a high side switch being on and a low side switch being off to the high side switch being off and the low side switch being on, and vice versa. The operational amplifiers have limited slew rate. Further, with their limited bandwidth due to the capacitances introduced to stabilize the closed loop, the operational amplifiers are not able to sink or source current with the speed that is sometimes requested by the system. This problem introduces, in the best case, a systematic offset in the tracking current or, in the worst case, does not reach the tracking condition in time because the time is too short.

In contrast, systems using circuits described herein, such as pre-biasing circuit 100, are able to track the positive and negative current that flows both in the high side switch and the low side switch of the half bridge, the hand over from high side switch on and low side switch off to high side switch off and low side switch on (and vice versa), and provide a proportional current as output. The settling time due to the switching between high side switch and low side switch is almost reduced to zero. While boosting techniques described above with respect to FIG. 4 may speed up the handover between high side and low side, pre-biasing techniques described with respect to FIG. 5 may be more efficient. These pre biasing techniques may also improve performance of both non-linear systems as well as systems that rely on linear sensing amplifiers.

When a half-bridge is coupled to an inductive load, and to minimize the settling time needed to reach the operational current of the low side power transistor of a half-bridge during turn-on or "restart" (e.g., transitions from operating in an off-state to operating in an on-state), pre-biasing circuit 100 may pre-bias current source 108-3 to be ready to source the same amount of current that is flowing through the conduction channel of the high side power transistor (e.g., the power transistor that is operating in the on-state). In other words, when the low side power and sense transistors of the half bridge are switched off, current source 108-3 may maintain a gate source voltage bias corresponding to the operational current that is flowing in the high side power transistor. This enables current source 108-3 to be ready to provide the correct operational current that will be needed by the low side sense transistor, when the low side power and sense transistors restarts.

Certain benefits of pre-biasing circuit 100 are evident from the description of FIG. 6. In short, pre-biasing circuit 100 may reduce the settling time of a tracking current sense (e.g., the amount of time that a tracking current sense takes before it settles to the load current through the conduction channel of a power switch) of a half-bridge, while such a half-bridge is powering an inductive load. In particular, when transitioning from an off-state to an on-state, pre-biasing circuit 100 may enable the current source associated with the sense FET of the power switch that is turned-off to maintain a pre-biasing and "stand-by" ready and waiting to sink or source the current as it will be required by the power switch, when the power switch is switches back-on, to cause there to be little difference in voltage drop between the sense FET and power switch.

FIG. 6 is a schematic diagram illustrating current sense system 400 for a half-bridge circuit that includes high side switch 402 coupled at switching node 410 (OUT) to low side switch 430. Tracking current sense system 400 is configured to track positive and negative currents that flow in both high side switch 402 and low side switch 430, in accordance with one or more techniques described in this disclosure. Tracking current sense system 400 is able to track positive and negative current without discontinuities. Various examples of tracking current sense system 400 may include aspects or features described herein with respect to other example circuits, such as, for example, pre-biasing circuit 100 of FIG. 5.

As described throughout the disclosure, for the example current tracking systems that rely on a high side power transistor and a high side sense transistor as well as a low side power transistor and a low side sense transistor, it should be understood that these current tracking systems may use monolithic or separate transistor solutions. For example, in instances where a system uses a high side power transistor and a high side sense transistor, the system may use a single high side monolithic-transistor component or two separate high side transistor components to perform the high side power transistor and the high side sense transistor functionality.

In instances where a system uses a low side power transistor and a low side sense transistor, the system may use a single low side monolithic-transistor component or two separate low side transistor components to perform the low side power transistor and the low side sense transistor functionality. Said differently, high side switch 402 shown in FIG. 6, including power transistor 136-1 and sense transistor 136-2, may comprise a single high side monolithic-transistor component or two separate high side transistor components. Low side switch 430 shown in FIG. 6, power transistor 136-3 and sense transistor 136-4, may comprise a single low side monolithic-transistor component or two separate low side transistor components.

Additionally the transistors 136-1 and 136-2 and the transistors 136-3 and 136-4 may comprise one of a single high and low side monolithic-transistor component or two to four separate high side and low side transistor components. In fact, generally, for any of the power switches described herein (i.e., power switch 18-0, 402, 430, etc.) the power transistor of the power switch and the sense transistor of the power switch can be monolithically integrated, along with their respective tracking current sense systems, onto a single die (e.g., a single piece of silicon). Said another way, each of the systems 10, 80, 100, 400, etc. may each be formed on a single piece of silicon.

Tracking current sense system 400 includes high side switch 402 includes power FET 136-1 and sense FET 136-2, having sources that are coupled to high side comparator 140-1. Low side switch 430 includes power FET 136-3 and a sense FET 136-4 coupled to comparator 140-2. Switching node 410 (OUT$_{HALF\_BRIDGE}$) is an output for the half bridge where an inductive load may be connected. Tracking current sense system 400 includes current sources 420-1 through 420-7 (collectively referred to herein as "current sources 420").

Tracking current sense system 400 further includes transistors M1 through M5, some of which may act as current mirrors, as described above. Current mirror 502 is a first current mirror of system 400 and is coupled between high side switch 402 and auxiliary comparator 406. First current mirror 502 includes two transistors, M1 and M2. Likewise, current mirror 504 is a second current mirror of system 400 and is coupled between low side switch 430 and auxiliary comparator 406. Second current mirror 504 includes three transistors, M3, M4, and M5. Tracking current sense system 400 also includes two buffers 404-1 and 404-2 (collectively referred to herein as "buffers 404").

Tracking current sense system 400 further includes comparators 140-1, 140-2, and 406 instead of operational amplifiers (i.e., transconductances) to control output of current mirrors 502 and 504. Comparators 140-1, 140-2, and 406 enable tracking current sense system 400 to use the maximum speed offered by other components in tracking current sense system 400 because there are no bandwidth limiting stabilizing capacitors that must be charged and discharged. The outputs of comparators 140-1, 140-2, and 406 drive the gates of switches 414 and the collection of switches 432 that control current sources 420-2, 420-3, 420-5 and 420-6 that charge or discharge capacitors 413-1 and 413-2 which are connected to the gates (bases) of the transistors M1-M5 in current mirrors 502 and 504 through the buffers 404. The current output capabilities of the controlled current sources 420-2, 420-3, 420-5 and 420-6 and capacitance characteristics of capacitors 413-1 and 413-2 may be selected to fulfill speed requirement of tracking current sense system 400. The output of comparator 140-2 controls switches 432-1 through 432-4 (collectively referred to as "switches 432") coupled to current sources 420-5 and 420-6. The output of comparator 140-1 controls switches 414-1 through 414-4 (collectively referred to as "switches 414") coupled to current sources 420-2 and 420-3.

Buffer 404-2 is coupled between capacitor 413-2 and the gates of transistors M3, M4, and M5, as well as other components of system 400. Buffer 404-1 is coupled between capacitor 413-1 and the gates of transistors M1 and M2, as well as other components of system 400.

Tracking current sense system 400 also includes two multiplexers ("MUX") 440-1 and 440-2 (collectively referred to herein as "MUXs 440"). MUX 440-1 receives as input a pulse width modulation (PWM) signal and outputs of comparators 140-1 and 406. MUX 440-1 multiplexes these signals together to control switches 414. Similarly, MUX 440-2 receives as input the same PWM signal and outputs of comparators 140-2 and 406. MUX 440-2 multiplexes these signals together to control switches 432. Thus, the PWM digital signal drives the MUXs 440 in order to connect comparators 140-1 and 140-2 or auxiliary comparator 406 to the switches 414 and 432.

In operation, when high side switch 402 is switched-on, low side switch 430 is switched-off. When the PWM is high, high side switch 402 is switched-on and the load current flows in the power FET 136-1 and so the output of comparator 140-1 drives switches 414. For example, comparator 140-1 drives switches 414 that control M1 and M2 and auxiliary comparator 406 drives switches 432 in order to control M3, M4, and M5. Auxiliary comparator 406 and M3, M4, and M5 work as a current follower. During this time, low side switch 430 is switched-off and thus no current flows in either the power FET 136-3 or sense FET 136-4 of low side switch 430.

When the PWM is low, low side switch 430 is switched-on and high side switch 402 is switched-off. The current flows in power FET 136-3 and so the output of comparator 140-2 drives switches 432. For example, comparator 140-2 drives switches 432 so as to control M3, M4, and M5 and auxiliary comparator 406 drives switches 414 so as to control M1 and M2. Auxiliary comparator 406 and M1 and M2 work as a current follower. During this time, high side switch 402 is switched-off and thus no current flows in either power FET 136-1 or sense FET 136-2 of high side switch 402.

Tracking current sense system 400 is able to track positive and negative current without any discontinuities. This functionality is guaranteed by current generators 420-1 and 420-4 that source the maximum negative current $I_{MAX\_NEGATIVE\_CURRENT}$. Tracking current sense system 400 may track the current at either switches 402 or 430, even if the switching frequency is high and/or current ripple of the load current flowing through switches 402 and 430 is very high, because it is based on non-linear circuits and uses the pre-biasing circuit. Settling times, when the half bridge transitions between outputting current from high side switch 402 and low side switch 430, are reduced due to the pre-biasing circuit.

Comparator 406 is configured to maintain $V_{feedback}$ within a threshold difference level of $V_{ref}$. For example, comparator 406 may maintain $V_{feedback}$ approximately the same as $V_{ref}$. This implies that the current $I_{SENSE\_HS\_COPY}$ out of transistor M3 approximately matches the current $I_{SENSE\_LS\_COPY}$ going into transistor M2.

Tracking current sense system 400 may perform as follows. The M1 transistor sinks a current $I_{M1} = I_{MAX\_NEGATIVE} + I_{feedback}$. Transistor M1 can only sink positive currents and therefore the expression above is only true as long as $I_{M1}$ stays positive. This means that the system has a functional limit to track negative load currents (e.g., current flowing into the half bridge output 410). Whereas theoretically infinitely high positive currents can be tracked (e.g., current flowing out of the half bridge output 410).

As auxiliary comparator 406 works to have $V_{FEEDBACK} = V_{ref}$, this means that $I_{M1}/M = I_{M2} = I_{M3} = I_{M4}$ and so to have the current that flows out of or in $$I_{OUT_{CURRENT\_SENSE}} = I_{feedback}/M$$

the offset current $I_{MAX\_NEGATIVE\_CURRENT}$ added by current sources 420-1 and 420-4 has to be subtracted at the end by current source 420-7. For both positive and negative load currents, the $$I_{OUT_{CURRENT\_SENSE}}$$

current may be:

$$I_{OUT_{CURRENT\_SENSE}} = \frac{I_{M1}}{M} - \frac{I_{MAX_{NEGATIVE_{CURRENT}}}}{M}$$
$$= \frac{I_{MAX_{NEGATIVE_{CURRENT}}} + I_{feedback}}{M} -$$
$$\frac{I_{MAX\_NEGATIVE\_CURRENT}}{M}$$
$$= \frac{I_{feedback}}{M}$$

Low side switch 430 of tracking current sense system 400 directly supplies $$I_{OUT_{CURRENT\_SENSE}}.$$

As described above, $$I_{OUT_{CURRENT\_SENSE}} = \frac{I_{feedback}}{M}$$

for both positive current and for negative current. In some examples, an accuracy required of low side switch 430 is higher than the accuracy required for high side switch 402. During $T_{OFF}$, while low side switch 430 is a switched-on, auxiliary comparator 406 drives switch 414 that control current mirror 502 in order to follow the current that flows in low side switch 430.

Comparator 406 drives the tracking current generator connected to the part of the half-bridge that is switched-off, and so, maintains the biasing of the current mirror 502 or 504 that is not currently being used to provide a feedback signal to be at the same biasing of the other current mirror 502 or 504 that is being used to provide a feedback signal. In this way, the oscillations and settling time after the switching operations from low side switch 430 to high side switch 402 and vice versa is reduced.

Figure 7A:
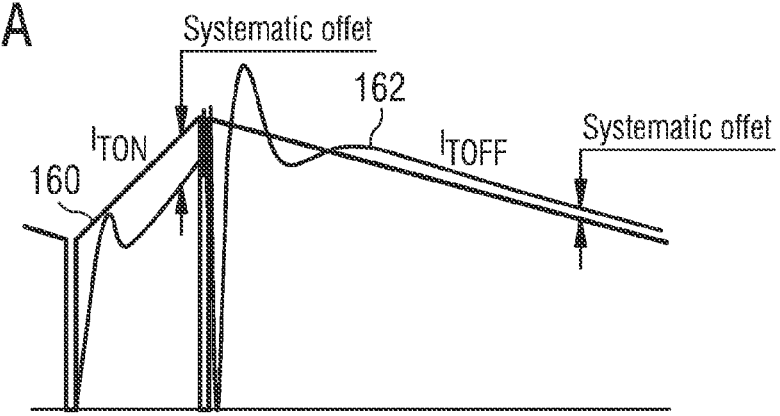
FIGS. 7A-7C are timing diagrams illustrating example currents in different tracking current sense systems, in accordance with one or more techniques described in this disclosure.
Figure 7B:
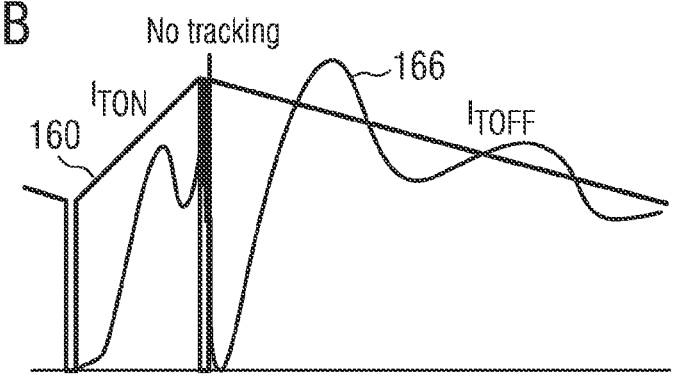
Figure 7C:
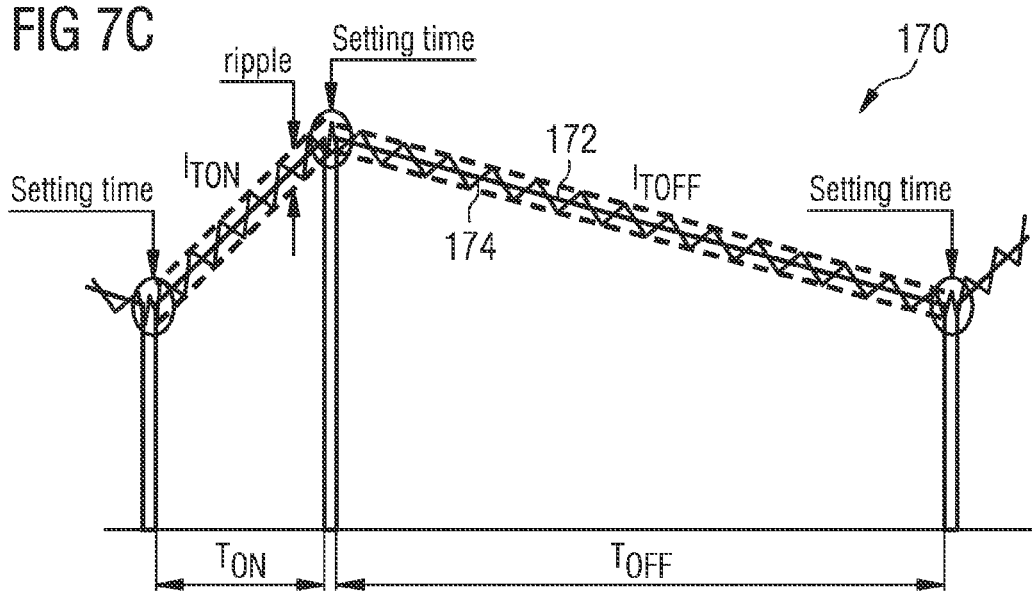

FIGS. 7A-7C are timing diagrams illustrating example currents in different tracking current sense systems, in accordance with one or more techniques described in this disclosure. FIG. 7A illustrates a systematic offset that can arise in a tracking current sense systems that uses a linear amplifier and does not include a pre-biasing circuit, such as pre-biasing circuit 100 of FIG. 5. Curve 160 shows an idealized tracking current in the tracking current sense system and curve 162 shows an actual tracking current in the tracking current sense system. As shown in FIG. 7A, there is a systematic offset between the idealized current in curve 160 and the actual current in curve 162.

FIG. 7B illustrates how a tracking condition may not be reached in a tracking current sense systems that uses a linear amplifier and does not include a pre-biasing circuit, such as pre-biasing circuit 100 of FIG. 5. Curve 160 illustrates an idealized tracking current in the tracking current sense system. Curve 166 illustrates an actual tracking current in the tracking current sense system. In the example of FIG. 7B, the actual tracking current shown as curve 166 does not reach the tracking condition because the time between $T_{ON}$ and $T_{OFF}$ is too short.

FIG. 7C shows a timing diagram 170 that illustrates example behavior of tracking current in a tracking current sense system that uses a comparator and has pre-biasing, such as tracking current sense system 400 of FIG. 6. Timing diagram 170 illustrates ideal behavior of tracking current $I_{feedback}$, represented by curve 172, as compared to an example real-world (i.e., less-ideal) behavior of tracking current $I_{feedback}$, represented by curve 174, over a time period $T_{ON}$ and $T_{OFF}$. In this example, during $T_{ON}$, high side transistor 402 of FIG. 6, is switched-on and low side transistor 430 of FIG. 6 is switched-off. During $T_{OFF}$, the opposite is true, and low side transistor 430 is switched-on while high side transistor 402 is switched-off. In this example, a PWM signal input to MUX 440-1 and MUX 440-2 is high during $T_{ON}$ and low during $T_{OFF}$.

Curve 174 shows ripples, oscillations, or spikes, which may be due to several factors including the speed and trans-conductance of comparators 140-1, 140-2, and 406 and the current used to charge a capacitor. In some examples, these parameters are chosen in order to reduce or minimize the amount of ripples, oscillations, or spikes of $I_{feedback}$ shown in curve 174. In some examples, various trade-offs are balanced when reducing the amount of ripples, oscillations, or spikes. In one example, the period of the first saw tooth may be approximately 5 nanoseconds ("ns").

There may be settling times during each transition between of $T_{ON}$ and $T_{OFF}$. During $T_{ON}$, a low side mirror, follows the current that flows in a high side mirror. A low side mirror may supply the output current. During $T_{OFF}$, the high side mirror may follow the current that flows in the low side mirror. The low side mirror supplies the output current. In this example, a low side capacitor, has been charged such that the low side mirror has approximately the same current that flowed in the high side mirror while the PWM was high (e.g., the low side mirror was pre-biased). When low side comparator 140-2 starts to drive the low side mirror, the current that flows in the low side mirror has the correct value. This functionality removes or reduces the settling time each time the PWM goes from high to low (e.g., in the transition from $T_{ON}$ to $T_{OFF}$). When the half bridge is loaded by an inductive load.

Example parameters for tracking current sense system 400 corresponding to the illustrated timing diagram of FIG. 7C may be as follows. A frequency of the PWM is 1 megahertz ("MHz") with a 10% duty cycle. $T_{ON}$ is approximately 100 nanoseconds ("ns") and $T_{OFF}$ is approximately 900 ns. In another example, the frequency of the PWM is 2 MHz, $T_{ON}$ is approximately 50 nanoseconds ("ns") and $T_{OFF}$ is approximately 450 ns. These parameters may be higher or lower, depending on requirements of half bridge tracking current sense system 400 and any other system the half bridge is used in.

FIG. 8 is a schematic diagram illustrating an example tracking current sense system 500 that is configured to track positive and negative currents that flow in both sides of a half bridge, in accordance with one or more techniques described in this disclosure. Similar to tracking current sense system 400 of FIG. 6, tracking current sense system 500 can track both positive and negative current. Tracking current sense system 500 can track changes in current direction without any discontinuity.

Tracking current sense system 500 is a half bridge that includes high-side switch 402 and low-side switch 430. High side switch 402 includes a high side power transistor 136-1 and a high side sense transistor 136-2. Similarly, low side switch 430 includes a low side power transistor 136-3 and a low side sense transistor 136-4. An auxiliary comparator 406 is coupled between high side switch 402 and low side switch 430. Auxiliary comparator 406 is configured to drive second current mirror 504 while high side switch 402 is active and to drive the first current mirror 502 while low side switch 430 is active. That is, auxiliary comparator 406 is configured to pre-bias, by at least one of current sources 508-1 and 508-2 driven by auxiliary comparator 406 and while high side switch 402 is inactive, a first capacitance 510-1 such that a current level in high side current mirror 502 is within a threshold operating level of the current in low side switch 430 that is active. That is, auxiliary comparator 406 works to pre-bias current mirror 502 which is a part of the sensing circuit for switch 402, while it is inactive. Further, auxiliary comparator 406 pre-biases a second capacitance 510-2 by at least one of current sources 508-3 and 508-4 driven by auxiliary comparator 406 while low side switch 430 is inactive, such that a current level in low side current mirror 504 is within a threshold operating level of an operating current in high side sense transistor 136-2 when high side switch 402 is active.

For example, auxiliary comparator 406 works to pre-bias the capacitance 510-1 and the current that flows in M2 and M1. If the gate source voltage is such that the current in M1 can be higher than $I_{MAX\_NEGATIVE\_CURRENT}$, it will go in to triode region if M1 is a MOS device (M1 will saturate if it is a bipolar junction transistor). The current that flows in will be equal to $I_{MAX\_NEGATIVE\_CURRENT}$, but $V_{GS}$ will be set in order to sink the right current as soon as it will be requested ($T_{OFF}$ transitioning to $T_{ON}$, for example). On the other hand, if the current that can flow in M1 is lower than $I_{MAX\_NEGATIVE\_CURRENT}$, the device M1 will dictate the current flow and $I_{MAX\_NEGATIVE\_CURRENT}$ will go into triode region.

One example operation of tracking current sense system 500 is as follows. While high side switch 402 is active (e.g., power transistor 136-1 and sense transistor 136-2 are active), M2 includes a copy of the current in M1. Comparator 406 works to charge and discharge the gate voltage of the transistors in the second current mirror 504, which includes M3, M4, and M5. When M2 sinks more current that M3 supplies, the feedback voltage of auxiliary comparator 406 is lower than $V_{ref}$. Increasing the charge in capacitors 510-2 increases a voltage drop between sources and gates of M3, M4, and M5. That is, comparator 406 works to make the current in M3 follow the current in M2 (a copy of the current in M1). M3 is a mirror and M4 includes a copy of the current in M3. The offset current $I_{max\_negative\_current}$ connected to high side sense FET 136-2 is a fixed reference current which is subtracted from the current sense output 412 (Scaled by a factor of M, $I_{max\_negative\_current}/M$). In this way, the current that flows out of current sense 412 is exactly a copy of the current that flows in high side sense FET 136-2 and is a copy of the current that flows in the $OUT_{HALF\_BRIDGE}$ (the output of the bridge 410) independently if the load current is positive or negative.

In some examples, a reference voltage, $V_{ref}$, input to comparator 406, is fixed. In other examples, the reference voltage is a variable reference voltage that can be set to compensate together with the 502 mirror ratio, for any difference in a current ratio between N1, the respective current ratio of high side switch 402, and N2, the respective current ratio of low side switch 430. For example, the respective current ratio N1 of high side switch 402 corresponds to a ratio between the current level of power transistor 136-1 and a current level of sense transistor 136-2. A respective current ratio N2 of low side switch 430 corresponds to a ratio between the current level of power transistor 136-3 and the current level of sense transistor 136-4. In some examples, the reference voltage (e.g., M2-M1 ratio) can be set to compensate for any differences between the respective current ratios N1 and N2 of high side switch 402 and low side switch 430.

As shown in FIG. 8, tracking current sense system 500 includes a resistor network 520 coupled to comparator 406. Resistor network 520 includes a variable resistor 522 configured to adjust a reference voltage coupled to an input of comparator 406. Resistor network 520 may be used to reduce the magnitude of the triangular current waveform at output 412 $OUT_{CURRENT\_SENSE}$ during the $T_{ON}$ phase. Because the current that flows out of pin $OUT_{CURRENT\_SENSE}$ 412 during this phase is due to the current follower made with auxiliary comparator 406, there are some delays that increase the size of the triangular oscillation. This delay is also due to a low pass filter existing in the node $V_{FEEDBACK}$ 590. In order to increase the cutoff frequency of this filter, a resistor network 520 is included because its impedance is much lower than transistors M2 and M3. Thus, the size of the triangular wave is reduced.

Tracking current sense system 500 can trim differences between the current ratio of high side switch 402 and the current ratio of low side switch 430 so that high side switch 402 and low side switch 430 have approximately the same current values when low side switch 430 ceases operating and high side switch 402 begins operating, and vice versa. To trim the mirror ratio between sense FET 136-2 and power FET 136-1 of high side switch 402, the mirror ratio between transistors M1 and M2 can be trimmed by changing the size or "width" of one of the transistor M1 or M2. In this way the mirror ratio of high side switch 402 and the mirror ratio of low side transistor 430 can be trimmed to match. In order to trim any possible residual offset or the offset created by the change of the mirror ratio between transistors M1 and M2, the reference voltage $V_{REF}$ can be changed. Tracking current sense system 500 can also adjust trim in this way to correct any differences due to temperature and/or currents that flow in power FETs 136-1 and 136-3. Tracking current sense system 500 provides a practical solution because adjustments can be made to compensate for differences in a mirroring ratio. Resistor network 520 may also improve performance of tracking current sense system 500.

In some examples tracking current sense system 500 is part of a DC-DC converter that relies on the operations of high side switch 402 and low side switch 430 to produce a power amplified PWM signal at node 410. A controller of the DC-DC converter may provide, via driver circuits, a gate signal to the respective gates of high side switch 402 and low side switch 430. Tracking current sense system 500 includes current sense output 412 coupled to second current mirror 504 that is configured to provide an output current $OUT_{CURRENT\_SENSE}$ which is indicative of the current in the half-bridge output node 410. That is, current tracking sense system 500 may be used to track the load/inductor current of a DC-DC converter to which it is coupled.

FIG. 9 is a flowchart illustrating an example process 560 for operating a tracking current sense system configured to track positive and negative currents that flow in both sides of a half bridge, in accordance with one or more techniques described in this disclosure. The example process 560 may be employed to operate devices and techniques illustrated in this disclosure, such as tracking current sense systems 400 and 500.

Process 560 includes operating a half bridge including a high side switch and a low side switch (562). For example, tracking current sense system 400 may rely on high side switch 402 and low side switch 430 to produce a power amplified PWM signal at output node 410.

Process 560 further includes controlling, by a comparator, a first current mirror coupled to the high side switch and a second current mirror coupled to the low side switch (564). For example, comparator 406 may produce an output that drives current mirror 504 while high side switch 402 is switched-on and low side switch 430 is switched-off. Alternatively, comparator 406 may drive current mirror 502 while low side switch 430 is switched-on and high side switch 402 is switched-off.

FIG. 10 is a schematic diagram illustrating an example tracking current sense system 300 that is configured to detect zero-crossings of the current in a half bridge, in accordance with one or more techniques described in this disclosure. Tracking current sense system 300 is configured to track the positive and negative currents that flow both in a high side switch 132 and a low side switch 134 of a half bridge circuit and provide a proportional output current according to the direction, e.g., positive current flow or negative current flow, of the current at the half-bridge.

Tracking current sense system 300 can track the current even if the switching frequency of the half bridge driver is very high or is operated with very short $T_{ON}$ or $T_{OFF}$ times, because it is based on a non-linear circuits and pre-biasing circuits. The settling time is reduced when the current direction changes and when the half bridge switches from operating high side switch 132 on to operating low side switch on, and vice versa.

Tracking current sense system 300 includes two power switches, high side switch 132 and low side switch 134, and two main current mirrors, current mirror 302 for tracking positive currents and current mirror 304 for tracking negative currents. Tracking current sense system 300 includes three comparators that drive some switches that control the charge and discharge of two capacitors using current sources. Tracking current sense system 300 includes high side comparator 140-1, low side comparator 140-2, and zero-crossing comparator 306. Main current mirror 302 for tracking positive currents includes five transistors, MP1 through MP5. Similarly, main current mirror 304 for tracking negative currents includes five transistors, MN1 through MN5.

An example operation of tracking current sense system 300 is as follows. When low side switch 134 is switched on (signal "GL" is high), low side comparator 140-2 controls one of the main current mirrors, depending on zero-crossing comparator 306. If the current direction is positive, MN5 will be connected as a diode to make sure that negative main current mirror 304 is pre-biased in a sleep state. The active current mirror in this example, positive main current mirror 302, may compensate for the offset that negative main current mirror 304 is adding to three summing nodes. One summing node includes MN1 and MP1 and is connected to the sense transistor 136-4 in low side switch 134. The second summing node includes MN2 and MP2 and is connected to a replica current, $I_{out\_replica}$, which may be the output of the tracking current sense system, and a third summing node includes MN4 and MP4 and is connected to the input of a zero current crossing comparator. Similarly, the same will happen for a negative current direction: MP5 will be connected as a diode and MN5 will no longer be, and negative main current mirror 304 will be actively controlled by low side comparator 140-2. Transistors MP4 and MN4 act as mirrors of current MP1 and MN1.

Zero-crossing comparator 306 measures the voltage on a summing node that is connected to one current source transistor from each of the two main current mirrors 302 and 304. In the example of FIG. 10, zero-crossing comparator 306 is connected to MN4 and MP4. When a load current at switching node 390 is approaching zero and finally changes direction, a voltage potential of the summing node between MN4 and MP4 changes. When the current direction change is from positive to negative, zero-crossing comparator 306 detects the change and directs control from positive main current mirror 302 to negative main current mirror 304. Similarly, when the current direction change is from negative to positive, zero-crossing comparator 306 detects the change and directs control from negative main current mirror 304 to positive main current mirror 302.

When the half bridge switches from operating low side switch 134 on to instead operating high side switch 132 on, or vice versa, the current sensor is using the same main current source to track current through low side switch 134 as well as current through high side switch 132 when the load current direction in the inductive load is the same. Only control comparator, 140-1 or 140-2, is changed depending on which switch (high side switch 132 or low side switch 134) is being sensed. Whichever main current mirror of tracking current sense system 300 that is not currently active is pre-biased and delivers a fixed base/offset current to the three summing nodes between current mirrors 302 and 304 and a forth summing node between the high side current mirrors 308 and 310. Thus, the inactive main current mirror is ready to perform, with reduced settling time, once zero-crossing comparator 306 detects a zero current crossover.

If the current changes direction in the load coupled to node 390, a second complementary main current source is activated and the first current source is parked in a kind of sleep mode. Again, the same main current source is used for both high side switch 132 and low side switch 134. The outputs of the two main current sources are summed both at the sense transistors 136-4 and 136-2, the current replica output and the zero current crossing comparator input. While one main current source is active the other one is in a kind of sleep mode. During this sleep mode, the current source is biased to deliver a small base/offset current. This base/offset current ensures that the current source activation will be fast in order to minimize the oscillation/ringing at the handover between the two current sources. This offset current will be compensated by the active current source and therefore it will not affect the static accuracy of the replica current. Since the handover between the two main current sources is done around zero load current and the second main current source is pre-biased and delivers a current to the sense transistors and replica output current, any hysteresis in zero-crossing comparator 306 can be handled and be beneficial to minimize toggling.

When a handover from low side switch 134 to high side switch 132 is done, the GL signal goes low, followed by a GH signal going high. To serve for a smooth handover from low side switch 134 to high side switch 132, the same main current mirror is used, only the control of the current mirror is changed from low side comparator 140-2 to high side comparator 140-1. The summing node used to bias the source of sense FET 136-2 has a mirror of the current from negative main current mirror 304 and positive main current mirror 302. Tracking current sense system 300 further includes two additional current mirrors, high side current mirror for positive currents 308 and high side current mirror for negative currents 310. High side current mirror for positive currents 308 includes transistors MN6 and MN7. High side current mirror for negative currents 310 includes transistors MP6 and MP7. The current mirrors MN6 and MN7 as well as MP6 and MP7 are depicted in FIG. 10 as classical current mirrors. These current mirrors may have some bandwidth limitations. In some examples, additional techniques and circuits described herein, such as that of FIGS. 11A and 11B, can be applied to speed up the current mirrors. Since these additional high side current mirrors, 308 and 310, are active even when the low side switch 134 is switched on and the same main current mirror is used, any handovers between low side switch 134 and high side switch 132, and vice versa, may be smooth.

When low side switch 134 and high side switch 132 are both switched off (that is, when transistors 136 are off) and the current is zero, both main current mirrors 302 and 304 may be placed in a "sleep" mode by connecting both MN5 and MP5 as diodes. This may enable a fast startup when the tracking current sense system 300 becomes active again.

The value of the controlled current sources and capacitor size may be chosen by the designer to fulfill the speed requirement of the system. In some examples, the techniques and circuits described herein for positive and negative current tracking may be used with linear current tracking systems. Furthermore, any devices and circuits described herein may be used in combination.

In summary, one difference between current sense system 400 of FIG. 6 and current sense system 300 of FIG. 10 is that current sense system 400 is a class A current sense system and therefore uses a simple offset current generator for the negative current that is set to supply the maximum negative current that could be required. So when a positive current is required, the system needs to supply a compensation current for the offset current generator plus the current representing the positive current that is required/sensed. Current sense system 300 is a class AB current sense system and it supplies either a negative current or a positive current depending on the direction of the sensed current, with only a small current offset in each direction to smoothen the handover between positive and negative current direction. In order to do this, current sense system 300 requires the ability to detect when the polarity of the current changes.

Figure 11A:
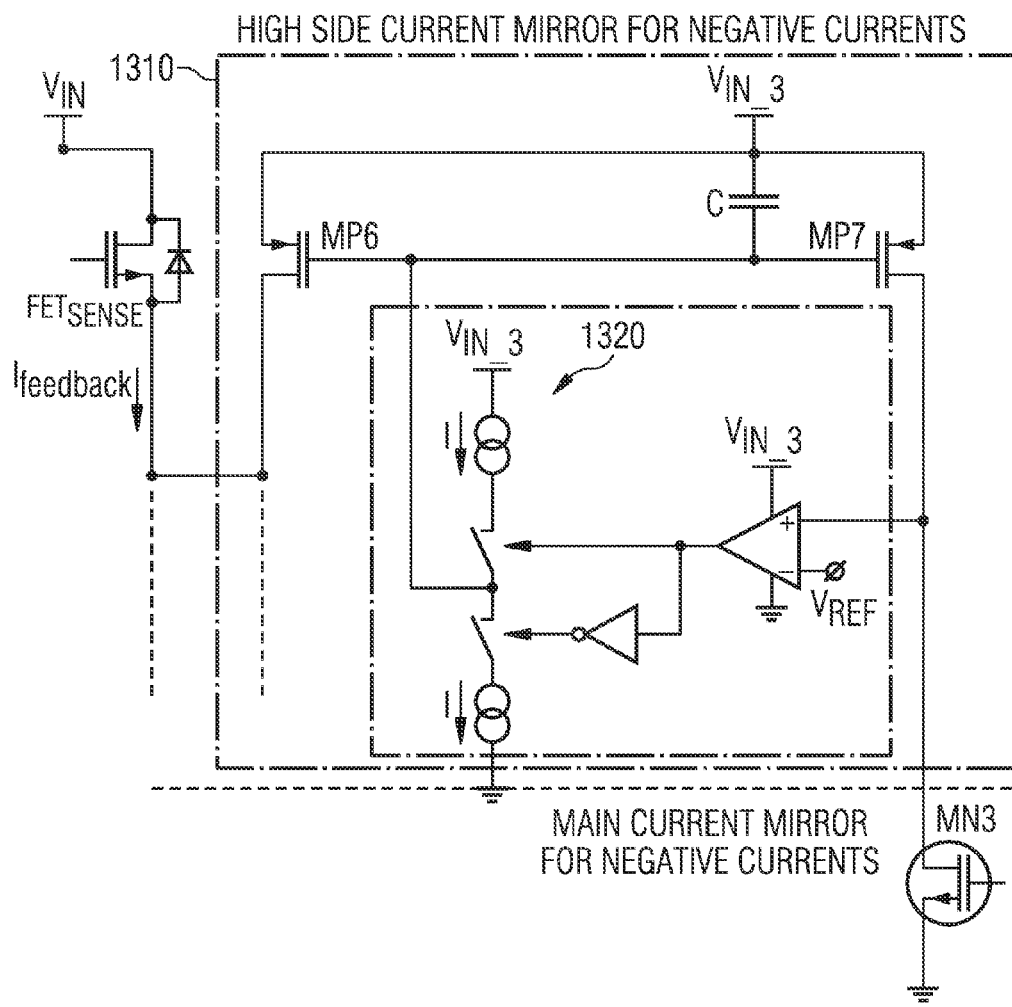

FIGS. 11A and 11B are schematic diagrams illustrating active current mirrors 1308 and 1310 for use in an example tracking current sense system, in accordance with one or more techniques described in this disclosure. For ease of description, FIGS. 11A and 11B are described within the context of system 300 of FIG. 10.

Current mirrors 308 and 310 of FIG. 10 are classical current mirrors. These current mirrors may have a limited bandwidth and not be fast enough to track a change the current flowing through sense FETs 136-2 and 136-4. Active current mirrors 1308 and 1310 can be used to overcome the drawbacks of classical current mirrors 308 and 310.

Active current mirrors of 1308 and 1310 of 12A and 12B include circuits 1322 and 1320, respectively. Current mirror 308 of FIG. 10 can be replaced with current mirror 1308 and current mirror 310 of FIG. 10 can be replaced with current mirror 1310. The transistors MP3, MP6, MP7, MN3, MN6, and MN7 shown in FIGS. 11A and 11B are identical to transistors MP3, MP6, MP7, MN3, MN6, and MN7 shown in FIG. 10. Although not shown, active current mirrors 1308 and 1310 could also include a resistor network similar to resistor network 520 of FIG. 8, coupled to an input of each of the respective comparators shown in FIGS. 11A and 11B.

When the voltage $V_{ref}$ is stable, the comparators of circuit 1322 drives the switches of circuit 1322 so as to cause the current flowing through transistors MN7 to be at the same level as the level of the current that is flowing through MP3. Similarly, when the voltage $V_{ref}$ is stable, the comparators of circuit 1320 drives the switches of circuit 1320 so as to cause the current flowing through transistor MP7 to be at the same level as the level of the current that is flowing through MN3. In this way, active current mirrors 1308 and 1310 can be used to overcome the drawbacks of classical current mirrors 308 and 310 since they may be fast enough to track changes to the current flowing through sense FETs 136-2 and 136-4.

The examples described herein may be used in a wide array of applications. Such applications may include, for example, DC-DC converters, which may include buck converters such as desktop or server central processing unit ("CPU") core voltage ("Vcore") and non-Vcore buck converters, single-phase point-of-load ("POL") application, multiphase POL applications, and high power density voltage regulator modules ("VRM"). Further, some of the examples described herein may be used in CPU or graphics processing unit ("GPU") regulation in notebooks, desktop graphics cards, double data rate ("DDR") memory, or graphic memory. Further, the devices and technologies described herein may be used in any applications using half bridges or full bridges.

FIG. 12 is a flowchart illustrating an example process 360 for operating a tracking current sense system having dual direction sensing, in accordance with one or more techniques described in this disclosure. The example process 360 may be employed to operate devices and techniques illustrated in this disclosure, such as tracking current sense system 300.

Process 360 includes operating a half bridge having a high side switch and a low side switch (362). For example, tracking current sense system 300 is a half bridge and includes high side switch 132 and low side switch 134. Process 360 further comprises detecting, by a zero-current crossing comparator, a zero-crossing of a current in the half bridge at a node between a main current mirror for positive currents and a main current mirror for negative currents, wherein one of the main current mirror for positive currents and a main current mirror for negative currents is an active current mirror and one is an inactive current mirror (364). For example, zero-current crossing comparator 306 detects a zero-crossing of a current in tracking current sense system 300 between main current mirror for positive currents 302 and main current mirror for negative currents 304.

Process 360 further includes responsive to detecting the zero-crossing of the current, switching the active current mirror to be inactive and the inactive current mirror to be active (366). While the current is negative, main current mirror for negative currents 304 is active and main current mirror for positive currents 302 is inactive. Similarly, while the current is positive, main current mirror for positive currents 302 is active and main current mirror for negative currents 304 is inactive. For example, responsive to zero-current crossing comparator 306 detecting a zero crossing of the current from negative current to positive current, tracking current sense system 300 activates main current mirror for positive currents 302 and deactivates main current mirror for negative currents 304. Similarly, responsive to zero-current crossing comparator 306 detecting a zero crossing of the current from positive current to negative current, tracking current sense system 300 activates main current mirror for negative currents 304 and deactivates main current mirror for positive currents 302.

In another example, process 360 includes detecting, at an output of the half bridge, either a positive current or a negative current (e.g., whether a current is positive or negative). In some examples, if both the high side switch of the half bridge and the low side switch of the half bridge are switched off, then, responsive to determining that the high side switch and the low side switch are both switched off, the logic may place both main current mirror for positive currents 302 and main current mirror for negative currents 304 into a sleep state. In other examples, if either high side switch 132 or low side switch 134 is switched on and the current is zero, then current tracking system 300 may toggle back and forth between positive current mirror 302 being active or negative current mirror 304 being inactive.

Clause 1. A tracking current sense system comprising: a first current tracking system configured to replicate a first current flowing through a first switch; a second current tracking system configured to replicate a second current flowing through a second switch; and a pre-biasing device configured to: pre-bias the second current tracking system based on first information detected at the first current tracking system that is indicative of the first current; and pre-bias the first current tracking system based on second information detected at the second current tracking system that is indicative of the second current.

Clause 2. The tracking current sense system of clause 1, wherein the second information is indicative of at least one of a respective level of the second current and a respective polarity of the second current and the first information is indicative of at least one of a respective level of the first current and a respective polarity of the first current.

Clause 3. The tracking current sense system of any of clauses 1-2, wherein the pre-biasing device is further configured to: receive the first information from the first current tracking system while the first current tracking system is replicating the first current; and receive the second information from the second current tracking system while the second current tracking system is replicating the second current.

Clause 4. The tracking current sense system of any of clauses 1-3, wherein the pre-biasing device is further configured to: receive the first information from the first current tracking system while the second current tracking system is refraining from replicating the second current; and receive the second information from the second current tracking system while the first current tracking system is refraining from replicating the second current.

Clause 5. The tracking current sense system of any of clauses 1-4, wherein the pre-biasing device is further configured to: pre-bias the second current tracking system at a first current level that corresponds to a respective level of the first current; and pre-bias the first current tracking system at a second current level that corresponds to a respective level of the second current.

Clause 6. The tracking current sense system of any of clauses 1-5, wherein the pre-biasing device is further configured to: pre-bias the second current tracking system based on the first information in response to the first current flowing in either direction; and pre-bias the first current tracking system based on the second information in response to the second current flowing in either direction.

Clause 7. The tracking current sense system of any of clauses 1-6, wherein the pre-biasing device is further configured to: pre-bias the second current tracking system based on the first information in response to the first current flowing in only one direction; and pre-bias the first current tracking system based on the second information in response to the second current flowing in only one direction.

Clause 8. The tracking current sense system of any of clauses 1-7, wherein at least one of: the first current tracking system is configured to replicate the first current flowing through the first switch while the first current is a first forward current or a first reverse current; or the second current tracking system is configured to replicate the second current flowing through the second switch while the second current is a second forward current or a second reverse current.

Clause 9. The tracking current sense system of any of clauses 1-8, wherein the first switch is a high side switch of a half bridge and the second switch is a low side switch of the half-bridge.

Clause 10. The tracking current sense system of clause 9, wherein the half-bridge is associated with a switched-mode power converter that outputs power to an inductive load.

Clause 11. A method comprising: receiving, at a pre-biasing device, information detected by a first tracking current sense system that is indicative of a first current flowing through a first switch; and pre-biasing, by the pre-biasing device, based on the information, a second tracking current sense system configured to replicate a second current flowing through a second switch.

Clause 12. The method of clause 11, wherein the information is indicative of at least one of a respective level of the first current and a respective polarity of the first current.

Clause 13. The method of any of clauses 11-12, wherein the information is first information, the method further comprising: receiving, at the pre-biasing device, second information detected by the second tracking current sense system that is indicative of the second current flowing through the second switch; and pre-biasing, by the pre-biasing device, based on the second information, the first tracking current sense system.

Clause 14. The method of any of clauses 11-13, wherein the information is received from the first current tracking system while the first current tracking system is replicating the first current.

Clause 15. The method of clause 14, wherein the information is received from the first current tracking system while the second current tracking system is refraining from replicating the second current.

Clause 16. The method of any of clauses 11-15, wherein pre-biasing the second tracking current sense system comprises pre-biasing the second tracking current sense system at a current level that corresponds to a level of the first current.

Clause 17. The tracking current sense system of any of clauses 11-16, wherein pre-biasing the second tracking current sense system comprises pre-biasing the second tracking current sense system in response to the first current flowing in either direction.

Clause 18. The tracking current sense system of any of clauses 11-17, wherein the current tracking system is configured to replicate the second current flowing through the second switch while the second current is a forward current or a reverse current.

Clause 19. The tracking current sense system of any of clauses 11-18, wherein the first switch is a high side switch of a half bridge and the second switch is a low side switch of the half-bridge, wherein the half-bridge is associated with a switched-mode power converter that outputs power to an inductive load.

Clause 20. A tracking current sense system comprising: means for replicating a first current flowing through a first switch; means for replicating a second current flowing through a second switch; and means for pre-biasing the second current tracking system based on first information received from the first current tracking system that is indicative of the first current; and means for pre-biasing the first current tracking system based on second information received from the second current tracking system that is indicative of the second current.

Various examples and techniques have been described. Aspects or features of examples described herein may be combined with any other aspect or feature described in another example. These described examples and other examples are within the scope of the following claims.

What is claimed is:

1. A tracking current sense system comprising:
a first current tracking system configured to replicate a first current flowing through a first switch;
a second current tracking system configured to replicate a second current flowing through a second switch; and
a pre-biasing device including an auxiliary comparator, a first current mirror, and a second current mirror, wherein the pre-biasing device is configured to:
drive, using the auxiliary comparator, the second current mirror to pre-bias the second current tracking system based on first information detected at the first current tracking system that is indicative of the first current; and
drive, using the auxiliary comparator, the first current mirror to pre-bias the first current tracking system based on second information detected at the second current tracking system that is indicative of the second current.

2. The tracking current sense system of claim 1, wherein the second information is indicative of at least one of a respective level of the second current and a respective polarity of the second current and the first information is indicative of at least one of a respective level of the first current and a respective polarity of the first current.

3. The tracking current sense system of claim 1, wherein the pre-biasing device is further configured to:
receive the first information from the first current tracking system while the first current tracking system is replicating the first current; and
receive the second information from the second current tracking system while the second current tracking system is replicating the second current.

4. The tracking current sense system of claim 1, wherein the pre-biasing device is further configured to:
pre-bias the second current tracking system at a first current level that corresponds to a respective level of the first current; and
pre-bias the first current tracking system at a second current level that corresponds to a respective level of the second current.

5. The tracking current sense system of claim 1, wherein the first switch is a high side switch of a half bridge and the second switch is a low side switch of the half-bridge.

6. A method comprising:
receiving, at a pre-biasing device, information detected by a first tracking current sense system that is indicative of a first current flowing through a first switch; and
pre-biasing, by the pre-biasing device, based on the information, a second tracking current sense system configured to replicate a second current flowing through a second switch by at least driving, by an auxiliary comparator of the pre-biasing device, a current mirror of the pre-biasing device to pre-bias the second current tracking system based on the first information.

7. The method of claim 6, wherein the information is indicative of at least one of a respective level of the first current and a respective polarity of the first current.

8. The method of claim 6, wherein the information is first information, the method further comprising:
receiving, at the pre-biasing device, second information detected by the second tracking current sense system that is indicative of the second current flowing through the second switch; and
pre-biasing, by the pre-biasing device, based on the second information, the first tracking current sense system.

9. The method of claim 6, wherein pre-biasing the second tracking current sense system comprises pre-biasing the second tracking current sense system at a current level that corresponds to a level of the first current.

10. The method of claim 6, wherein pre-biasing the second tracking current sense system comprises pre-biasing the second tracking current sense system in response to the first current flowing in either direction.

11. A tracking current sense system comprising:
means for replicating a first current flowing through a first switch;
means for replicating a second current flowing through a second switch; and
means for pre-biasing a second current tracking system based on first information received from a first current tracking system that is indicative of the first current, wherein the means for pre-biasing the second current tracking system includes means for driving a second current mirror to pre-bias the second current tracking system based on first information detected at the first current tracking system that is indicative of the first current; and means for pre-biasing the first current tracking system based on second information received from the second current tracking system that is indicative of the second current, wherein the means for pre-biasing the first current tracking system includes means for driving a second current mirror to pre-bias the first current tracking system based on second information detected at the second current tracking system that is indicative of the second current, wherein the means for driving the second current mirror and the means for driving the first current mirror comprise means for comparing two voltages.

12. The tracking current sense system of claim 1, wherein:
the first current mirror is coupled to the first switch; and
the second current mirror is coupled to the second switch.

13. The tracking current sense system of claim 12, wherein:
the auxiliary comparator is configured to drive the first current mirror by at least driving the first current mirror while the second switch is active; and
the auxiliary comparator is configured to drive the second current mirror by at least driving the second current mirror while the first switch is active.

14. The tracking current sense system of claim 12, wherein the pre-biasing device further comprises:
a first comparator configured to drive the first current mirror while the first switch is active; and
a second comparator configured to drive the second current mirror while the second switch is active.

15. The tracking current sense system of claim 1, wherein:
the pre-biasing device further comprises a third current mirror for positive currents and a fourth current mirror for negative currents, wherein:
the third current mirror for positive currents or the fourth current mirror for negative currents is an active current mirror configured to pre-bias, via the first current mirror, the first current tracking system or pre-bias, via the second current mirror, the second current tracking system, and
the third current mirror for positive currents or the fourth current mirror for negative currents that is not the active current mirror is an inactive current mirror; and
the auxiliary comparator comprises a zero-current crossing comparator configured to:
detect a zero crossing of a current at a node between the third current mirror for positive currents and the fourth current mirror for negative currents,
switch, in response to detecting the zero crossing of the current, the active current mirror to be inactive, and
switch, in response to detecting the zero crossing of the current, the inactive current mirror to be active.

16. The method of claim 6, wherein:
the current mirror is a second current mirror and is coupled to the second switch;
the pre-biasing device further comprises a first current mirror coupled to the first switch; and
the method further comprises controlling, by the auxiliary comparator, the first current mirror.

17. The method of claim 16, wherein:
controlling the first current mirror comprises driving, by the auxiliary comparator, the first current mirror while the second switch is active; and
driving the second current mirror comprises driving, by the auxiliary comparator, the second current mirror while the first switch is active.

18. The method of claim 16, wherein the pre-biasing device further comprises a first comparator and a second comparator, the method further comprising:
driving, by the first comparator, the first current mirror while the first switch is active; and
driving, by the second comparator, the second current mirror while the second switch is active.

19. The method of claim 6, wherein:
the auxiliary comparator is a zero-current crossing comparator;
the pre-biasing device further comprises a third current mirror for positive currents and a fourth current mirror for negative currents, wherein:
the third current mirror for positive currents or the fourth current mirror for negative currents is an active current mirror configured to pre-bias, via the first current mirror, the first current tracking system or pre-bias, via the second current mirror, the second current tracking system, and
the third current mirror for positive currents or the fourth current mirror for negative currents that is not the active current mirror is an inactive current mirror; and
the method further comprises:
detecting, by the zero-current crossing comparator, a zero crossing of a current at a node between the third current mirror for positive currents and the fourth current mirror for negative currents,
switching, by the zero-current crossing comparator and in response to detecting the zero crossing of the current, the active current mirror to be inactive, and
switching, by the zero-current crossing comparator and in response to detecting the zero crossing of the current, the inactive current mirror to be active.

* * * * *